United States Patent
Ogiwara et al.

(10) Patent No.: US 12,269,125 B2
(45) Date of Patent: Apr. 8, 2025

(54) LASER PROCESSING DEVICE AND LASER PROCESSING METHOD

(71) Applicant: HAMAMATSU PHOTONICS K.K., Hamamatsu (JP)

(72) Inventors: Takafumi Ogiwara, Hamamatsu (JP); Hayate Joan, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/288,613

(22) PCT Filed: Jan. 25, 2022

(86) PCT No.: PCT/JP2022/002640
§ 371 (c)(1),
(2) Date: Oct. 27, 2023

(87) PCT Pub. No.: WO2022/249541
PCT Pub. Date: Dec. 1, 2022

(65) Prior Publication Data
US 2024/0207978 A1    Jun. 27, 2024

(30) Foreign Application Priority Data
May 28, 2021  (JP) .................................. 2021-090392

(51) Int. Cl.
*B23K 26/53*        (2014.01)
*B23K 26/073*       (2006.01)
(Continued)

(52) U.S. Cl.
CPC ............ *B23K 26/53* (2015.10); *B23K 26/073* (2013.01); *G01N 21/9501* (2013.01); *H01L 21/67092* (2013.01)

(58) Field of Classification Search
CPC .. B23K 26/53; B23K 26/073; G91N 21/9501; H01L 21/67092
See application file for complete search history.

(56) References Cited

U.S. PATENT DOCUMENTS

| | | | |
|---|---|---|---|
| 2005/0037272 A1* | 2/2005 | Tanaka ................ | H01L 21/6715 430/311 |
| 2009/0278831 A1* | 11/2009 | Goh ...................... | G09G 3/3233 345/211 |
| 2020/0006909 A1* | 1/2020 | Kwon ................... | H01S 3/0085 |

FOREIGN PATENT DOCUMENTS

| | | |
|---|---|---|
| JP | 3762409 B2 | 4/2006 |
| JP | 2011-159827 A | 8/2011 |

(Continued)

OTHER PUBLICATIONS

English-language translation of International Preliminary Report on Patentability (IPRP) dated Dec. 7, 2023 that issued in WO Patent Application No. PCT/JP2022/002640.

*Primary Examiner* — Nahida Sultana
(74) *Attorney, Agent, or Firm* — Faegre Drinker Biddle & Reath LLP

(57) ABSTRACT

A laser processing device includes: a laser irradiation unit; and a control unit. The control unit is configured to execute a first control to control the laser irradiation unit to form modified regions for division along each of lines extending in an X direction and cracks extending from the modified regions in a direction of a surface, a second control to control the laser irradiation unit to form modified regions for division along each of a plurality of lines in a Y direction and cracks extending from the modified regions in the direction of the surface, and a third control to control the laser irradiation unit to form cracks extending from a plurality of modified regions for suppressing warpage before the second control, the cracks being formed to reach a back surface and (Continued)

not to be continuous with the cracks extending from the modified regions for division.

20 Claims, 23 Drawing Sheets

(51) Int. Cl.
    *G01N 21/95*     (2006.01)
    *H01L 21/67*     (2006.01)

(56) References Cited

FOREIGN PATENT DOCUMENTS

| | | |
|---|---|---|
| JP | 2013-171846 A | 9/2013 |
| JP | 2018-049914 A | 3/2018 |
| WO | WO-03/077295 A1 | 9/2003 |
| WO | WO-2010/122866 A1 | 10/2010 |
| WO | WO-2020/004210 A1 | 1/2020 |

\* cited by examiner

*Fig.9*
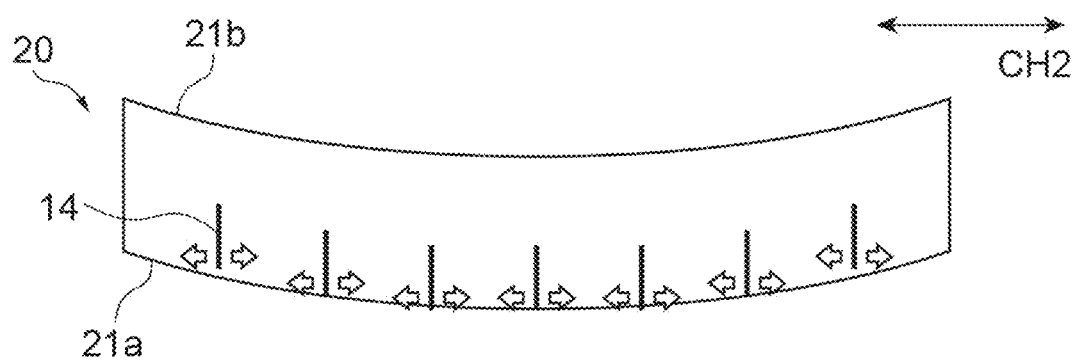
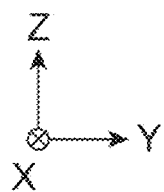

Fig.15
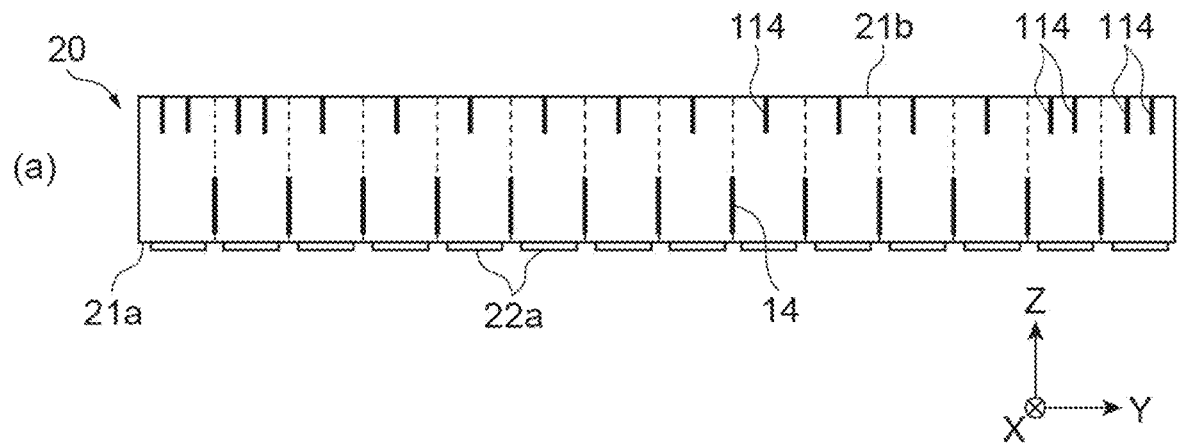
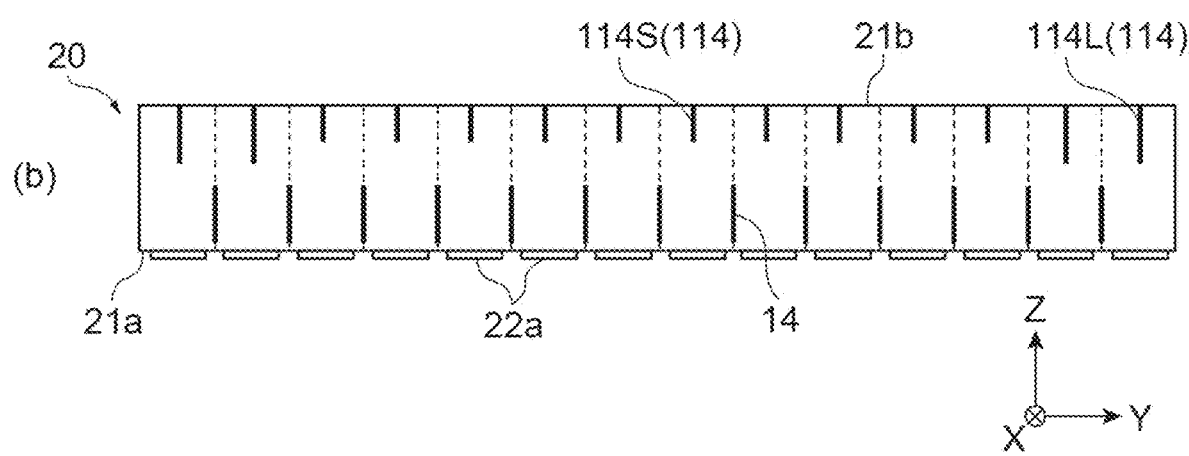
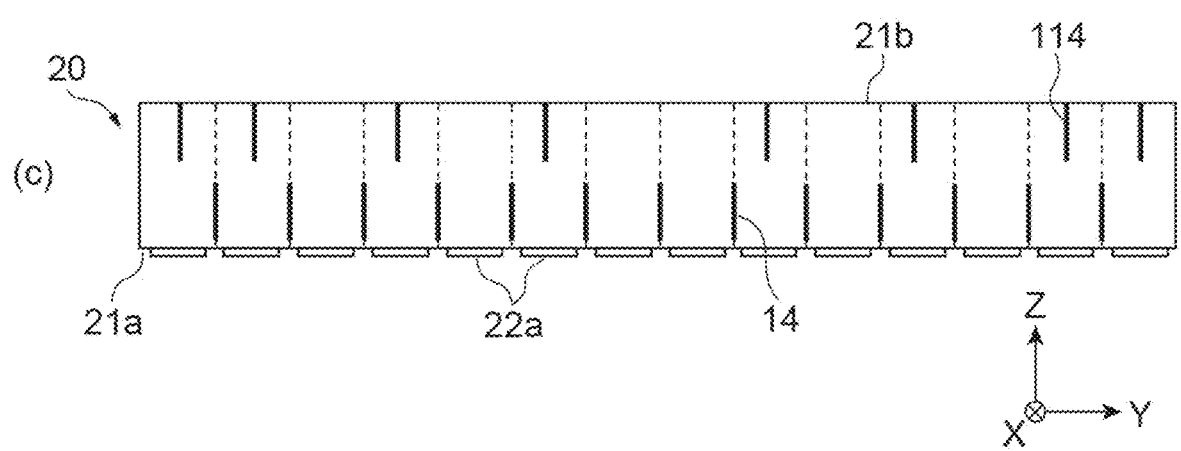

LASER PROCESSING DEVICE AND LASER PROCESSING METHOD

TECHNICAL FIELD

One aspect of the present invention relates to a laser processing device and a laser processing method.

BACKGROUND ART

In order to cut a wafer including a semiconductor substrate and a functional element layer formed on one surface of the semiconductor substrate, along each of a plurality of lines, a laser processing device that irradiates the wafer with a laser beam from the other surface side of the wafer to form a plurality of rows of modified regions for division (cutting) inside the semiconductor substrate along each of the plurality of lines has been known (for example, refer to Patent Literature 1). In such a laser processing device, semiconductor chips with high bending strength can be produced by grinding the modified regions after the modified regions are formed.

CITATION LIST

Patent Literature

Patent Literature 1: Japanese Patent No. 376209

SUMMARY OF INVENTION

Technical Problem

In laser processing using the laser processing device described above, the formation of modified regions for division may be sequentially performed along a plurality of lines intersecting each other. In this case, warpage occurs in a wafer due to the formation of the modified regions along the lines (first lines) irradiated with a laser beam earlier, and due to the influence of the warpage of the wafer, the accuracy of processing on the intersecting lines (second lines) irradiated with the laser beam later deteriorates, which is a risk. Namely, in a state where warpage has occurred, when the processing on the lines (second lines) irradiated with the laser beam later is performed, it becomes difficult to ensure the accuracy of autofocus and the like for adjusting the condensing spot of the laser beam during processing on the second lines, and the formation of the modified regions is not appropriately performed, which is a risk.

One aspect of the present invention has been conceived in view of the foregoing circumstances, and an object of the present invention is to improve the accuracy of laser processing by appropriately forming modified regions for division on an object.

Solution to Problem

According to one aspect of the present invention, there is provided a laser processing device including: a laser irradiation unit that irradiates an object including a first surface and a second surface opposite to the first surface with a laser beam using the first surface of the object as an incident surface; and a control unit. The control unit is configured to execute a first control to control the laser irradiation unit to form first modified regions for division and cracks extending from the first modified regions in a direction of the second surface inside the object by performing irradiation with the laser beam while moving a condensing spot of the laser beam relative to the object along each of a plurality of first lines extending in a first direction along the incident surface, a second control to control the laser irradiation unit to form second modified regions for division and cracks extending from the second modified regions in the direction of the second surface inside the object by performing irradiation with the laser beam while moving the condensing spot of the laser beam relative to the object along each of a plurality of second lines intersecting the first direction and extending in a second direction along the incident surface, after the first control, and a third control to control the laser irradiation unit to form a plurality of third modified regions for suppressing warpage and cracks extending from the third modified regions inside the object by performing irradiation with the laser beam before the second control, the cracks being formed to reach the first surface and not to be continuous with the cracks extending from the first modified regions.

In the laser processing device according to one aspect of the present invention, irradiation with the laser beam is performed to form the first modified regions for division along each of the plurality of first lines extending in the first direction along the incident surface, and to form the cracks extending from the first modified regions in the direction of the second surface, and thereafter, irradiation with the laser beam is performed to form the second modified regions for division along each of the plurality of second lines intersecting the first direction and extending in the second direction along the incident surface, and to form the cracks extending from the second modified regions in the direction of the second surface. In such a manner, when the formation of the modified regions is sequentially performed along the plurality of lines intersecting each other, warpage occurs in the object due to the formation of the first modified regions along the lines (first lines) irradiated with the laser beam earlier, and due to the influence of the warpage of the object, the accuracy of the processing on the lines (second lines) irradiated with the laser beam later deteriorates, which is a risk. Specifically, the warpage of the object occurs due to the concentration of stress on one side (here, the second surface located in the direction in which the cracks mainly extend) of the object caused by the formation of the first modified regions and the formation of the cracks extending from the first modified regions in the direction of the second surface. Such warpage of the object becomes particularly noticeable when the object is a microchip or when relatively large cracks are formed. Then, in a state where warpage has occurred, when the processing on the lines (second lines) irradiated with the laser beam later is performed, it becomes difficult to ensure the accuracy of autofocus and the like for adjusting the condensing spot of the laser beam during processing on the second lines, and the formation of the second modified regions is not appropriately performed, which is a risk.

In this regard, in the laser processing device according to one aspect of the present invention, prior to control related to the processing on the second lines (second control), irradiation with the laser beam is performed to form the plurality of third modified regions for suppressing warpage and the cracks extending from the third modified regions inside the object, the cracks being formed to reach the first surface and not to be continuous with the cracks extending from the first modified regions. In such a manner, since the third modified regions are formed such that the cracks reach the first surface opposite to the second surface on which stress concentrates due to the formation of the first modified regions for division, the localization of stress can be alleviated, and the warpage of the object can be reduced. Accordingly, in the processing on the second lines performed after the third modified regions for suppressing warpage are formed, the second modified regions can be appropriately formed. Then, the cracks extending from the third modified regions are formed not to be continuous with the cracks extending from the first modified regions, so that the occurrence of unintended cracking of the object can be appropriately suppressed by the formation of the third modified regions for suppressing warpage. As described above, according to the laser processing device of one aspect of the present invention, while suppressing the occurrence of unintended cracking of the object, the modified regions for division can be appropriately formed on the object, so that the accuracy of laser processing can be improved.

In the third control, the control unit may control the laser irradiation unit to form the third modified regions at positions different from formation positions of the first modified regions in the second direction. Accordingly, the continuity between the cracks from the first modified regions and the cracks from the third modified regions can be appropriately avoided, so that the occurrence of unintended cracking of the object can be more suitably suppressed.

In the third control, the control unit may control the laser irradiation unit to form the third modified regions at intermediate positions in the second direction between formation positions of two first lines adjacent to each other in the second direction. By forming the third modified regions at exactly the middle positions interposed between the two first lines, the separation distance between any of the modified regions along the first lines and the third modified regions can be increased, so that the continuity between the cracks from the first modified regions and the cracks from the third modified regions can be appropriately avoided. Accordingly, the occurrence of unintended cracking of the object can be suitably suppressed.

The laser irradiation unit may include a spatial light modulator that modulates the laser beam according to a set modulation pattern, and in the third control, the control unit may set the modulation pattern such that the third modified regions are formed at positions different from formation positions of the first modified regions in the second direction. In such a manner, by adjusting the formation positions of the third modified regions through the setting of the modulation pattern of the spatial light modulator, the processing time can be shortened compared to when the formation positions of the modified regions are changed by operating a stage.

The laser irradiation unit may include a spatial light modulator that modulates the laser beam according to a set modulation pattern, and in at least one of the first control and the third control, the control unit may set the modulation pattern such that positions of end portions on a first surface side of the cracks extending from the first modified regions are different from positions of end portions on a second surface side of the cracks extending from the third modified regions. In such a manner, by adjusting the positions of the end portions of the cracks extending from the modified regions through the setting of the modulation pattern of the spatial light modulator, the positions of the end portions of the cracks are appropriately adjusted, so that the occurrence of unintended cracking of the object due to the continuity of the cracks can be more suitably suppressed.

In the third control, the control unit may control the laser irradiation unit such that the cracks extending from the third modified regions are shorter than the cracks extending from the first modified regions. Unlike the cracks extending from the first modified regions for division, since the cracks extending from the third modified regions for suppressing warpage are not cracks that are desired to contribute to division, the occurrence of unintended cracking of the object due to the continuity of the cracks can be more suitably suppressed by shortening the cracks extending from the third modified regions.

In the third control, the control unit may control the laser irradiation unit to form a larger number of the third modified regions than the number of the first modified regions in the second direction. As described above, the cracks extending from the third modified regions for suppressing warpage are desired to be shortened in terms of performing appropriate division. However, when the cracks extending from the third modified regions are shortened, the warpage suppression effect is not sufficiently exhibited, which is a risk. In this regard, the number of the third modified regions is increased in the second direction (larger than the number of the first modified regions), so that the cracks extending from a large number of the third modified regions can suppress the occurrence of unintended cracking of the object while sufficiently exhibiting the warpage suppression effect.

In the third control, the control unit may control the laser irradiation unit to form the third modified regions such that when the third modified regions at a central portion of the object in the second direction are compared to the third modified regions at both end portions, at least one of the number of the third modified regions in the second direction being larger at both the end portions and a length of the cracks extending from the third modified regions being larger at both the end portions is satisfied. The warpage of the object caused by the formation of the first modified regions becomes noticeable toward both the end portions in the second direction. In this regard, the number of the third modified regions is set to be larger at the central portion of the object in the second direction than at both the end portions, or the length of the cracks extending from the third modified regions is increased, so that the warpage of the object at both the end portions in the second direction where the warpage is noticeable can be effectively suppressed.

The control unit may control the laser irradiation unit to alternately perform the formation of the first modified regions related to any of the first lines in the first control and the formation of the third modified regions in the third control. The warpage of the object caused by the formation of the first modified regions gradually progresses as the formation of the first modified regions related to the plurality of first lines proceeds. For this reason, the processing on the first lines processed earlier affects the processing on the first lines processed later. Namely, in the processing on the first lines processed relatively later among the plurality of first lines, since the first modified regions are formed in a state where the object is warped, for example, the cracks extend diagonally with respect to the second surface of the object, the processing position accuracy deteriorates, or poor suction occurs during processing, which is a risk. In this regard, the formation of the first modified regions for division and the formation of the third modified regions for suppressing warpage are alternately performed, so that the influence of the processing on the first lines processed earlier on the processing on the first lines processed later can be suppressed, and the first modified regions for division can be appropriately formed on the object.

The control unit may be configured to further execute a fourth control to control the laser irradiation unit to form a plurality of fourth modified regions for suppressing warpage and cracks extending from the fourth modified regions inside the object by performing irradiation with the laser beam, the cracks being formed to reach the first surface and not to be continuous with the cracks extending from the second modified regions, and may control the laser irradiation unit to alternately perform the formation of the second modified regions related to any of the second lines in the second control and the formation of the fourth modified regions in the fourth control. In such a manner, by alternately performing the formation of the second modified regions related to the second lines and the formation of the fourth modified regions for suppressing warpage, the influence of the processing on the second lines processed earlier on the processing on the second lines processed later can be suppressed, and the second modified regions for division can be appropriately formed on the object.

According to one aspect of the present invention, there is provided a laser processing method for performing laser processing on an object including a first surface and a second surface opposite to the first surface by irradiating the object with a laser beam using the first surface of the object as an incident surface, the method including: a first step of forming first modified regions for division and cracks extending from the first modified regions in a direction of the second surface inside the object by performing irradiation with the laser beam while moving a condensing spot of the laser beam relative to the object along each of a plurality of first lines extending in a first direction along the incident surface; a second step of forming second modified regions for division and cracks extending from the second modified regions in the direction of the second surface inside the object by performing irradiation with the laser beam while moving the condensing spot of the laser beam relative to the object along each of a plurality of second lines intersecting the first direction and extending in a second direction along the incident surface, after the first step; and a third step of forming a plurality of third modified regions for suppressing warpage and cracks inside the object by performing irradiation with the laser beam before the second step, the cracks being formed to reach the first surface from the third modified regions and not to be continuous with the cracks extending from the first modified regions.

In the third step, the third modified regions may be formed at positions different from formation positions of the first modified regions in the second direction.

In the third step, the third modified regions may be formed at intermediate positions in the second direction between formation positions of two first lines adjacent to each other in the second direction.

In the third step, the third modified regions may be formed at the positions different from the formation positions of the first modified regions in the second direction, by setting a modulation pattern of a spatial light modulator that modulates the laser beam.

In at least one of the first step and the third step, positions of end portions on a first surface side of the cracks extending from the first modified regions are set to differ from positions of end portions on a second surface side of the cracks extending from the third modified regions, by setting a modulation pattern of a spatial light modulator that modulates the laser beam.

In the third step, the third modified regions may be formed such that the cracks extending from the third modified regions are shorter than the cracks extending from the first modified regions.

In the third step, a larger number of the third modified regions than the number of the first modified regions may be formed in the second direction.

In the third step, the third modified regions may be formed such that when the third modified regions at a central portion of the object in the second direction are compared to the third modified regions at both end portions, at least one of the number of the third modified regions in the second direction being larger at both the end portions and a length of the cracks extending from the third modified regions being larger at both the end portions is satisfied.

The formation of the first modified regions related to any of the first lines in the first step and the formation of the third modified regions in the third step may be alternately performed.

The laser processing method may further include a fourth step of forming a plurality of fourth modified regions for suppressing warpage and cracks inside the object by performing irradiation with the laser beam, the cracks being formed to reach the first surface from the fourth modified regions and not to be continuous with the cracks extending from the second modified regions, and the formation of the second modified regions related to any of the second lines in the second step and the formation of the fourth modified regions in the fourth step may be alternately performed.

Advantageous Effects of Invention

According to one aspect of the present invention, it is possible to improve the accuracy of laser processing by appropriately forming the modified regions for division on the object.

BRIEF DESCRIPTION OF DRAWINGS

FIG. 9 is a view describing the principle of occurrence of warpage in the wafer.

FIG. 15 is a view describing a processing method for mainly suppressing warpage at an outer peripheral portion of the wafer.

DESCRIPTION OF EMBODIMENTS

Figure 1:
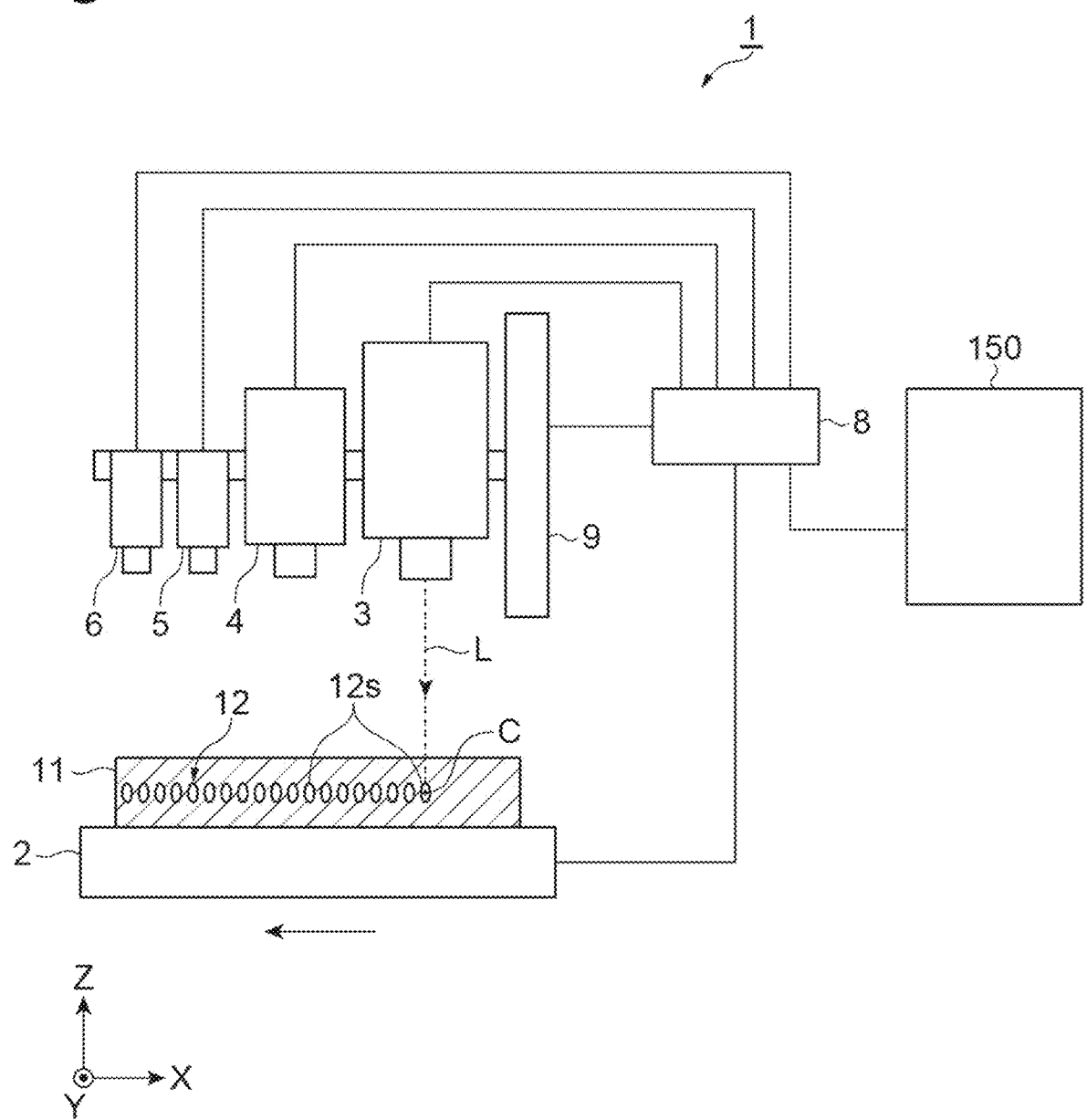
FIG. 1 is a configuration view of an inspection device of one embodiment.

Hereinafter, an embodiment of the present invention will be described in detail with reference to the drawings. Incidentally, in the drawings, the same or corresponding portions are denoted by the same reference signs, and duplicate descriptions will be omitted.

[Configuration of Inspection Device]

As shown in FIG. 1, a laser processing device 1 includes a stage 2, a laser irradiation unit 3, a plurality of imaging units 4, 5, and 6, a drive unit 9, a control unit 8, and a display 150 (display unit). The laser processing device 1 is a device that forms a modified region 12 in an object 11 by irradiating the object 11 with a laser beam L.

The stage 2 supports the object 11, for example, by suctioning a film attached to the object 11. The stage 2 is movable along each of an X direction and a Y direction, and is rotatable around an axis parallel to a Z direction. Incidentally, the X direction and the Y direction are a first horizontal direction and a second horizontal direction perpendicular to each other, and the Z direction is a vertical direction.

The laser irradiation unit 3 condenses the laser beam L having the property of transmitting through the object 11, and irradiates the object 11 with the laser beam L. When the laser beam L is condensed inside the object 11 supported by the stage 2, the laser beam L is absorbed particularly at a portion corresponding to a condensing spot C of the laser beam L, and the modified region 12 is formed inside the object 11.

The modified region 12 is a region that differs in density, refractive index, mechanical strength, and other physical characteristics from a surrounding non-modified region. Examples of the modified region 12 include a melt processing region, a crack region, a dielectric breakdown region, and a refractive index change region. The modified region 12 has a characteristic that cracks easily extend from the modified region 12 to an incident side of the laser beam L and to a side opposite to the incident side. Such a characteristic of the modified region 12 is used to cut the object 11.

As one example, when the stage 2 is moved along the X direction to move the condensing spot C relative to the object 11 along the X direction, a plurality of modified spots 12s are formed to be arranged in one row along the X direction. One modified spot 12s is formed by irradiation with one pulse of the laser beam L. One row of the modified regions 12 are a collection of the plurality of modified spots 12s arranged in one row. The modified spots 12s adjacent to each other may be connected to each other or may be separated from each other depending on the relative movement speed of the condensing spot C with respect to the object 11 and the repetition frequency of the laser beam L.

The imaging unit 4 is configured to capture an image of the modified regions 12 formed in the object 11 and of tips of cracks extending from the modified regions 12. Incidentally, the imaging unit 4 is not an essential component; however, in the present embodiment, the laser processing device 1 will be described as including the imaging unit 4.

The imaging unit 5 and the imaging unit 6 capture images of the object 11 supported by the stage 2, using light transmitting through the object 11 under the control of the control unit 8. As one example, the images obtained through image capturing by the imaging units 5 and 6 are used to align the irradiation positions of the laser beam L. Incidentally, the imaging units 5 and 6 are not essential components; however, in the present embodiment, the laser processing device 1 will be described as including the imaging units 5 and 6.

The drive unit 9 supports the laser irradiation unit 3 and the plurality of imaging units 4, 5, and 6. The drive unit 9 moves the laser irradiation unit 3 and the plurality of imaging units 4, 5, and 6 along the Z direction.

The control unit 8 controls operations of the stage 2, the laser irradiation unit 3, the plurality of imaging units 4, 5, and 6, and the drive unit 9. The control unit 8 is configured as a computer device including a processor, a memory, a storage, a communication device, and the like. In the control unit 8, the processor executes software (program) read into the memory or the like, and controls the reading and writing of data in the memory and the storage and communication through the communication device.

The display 150 has a function as an input unit that receives an input of information from a user, and a function as a display unit that displays information to the user.

[Configuration of Object]

Figure 2:
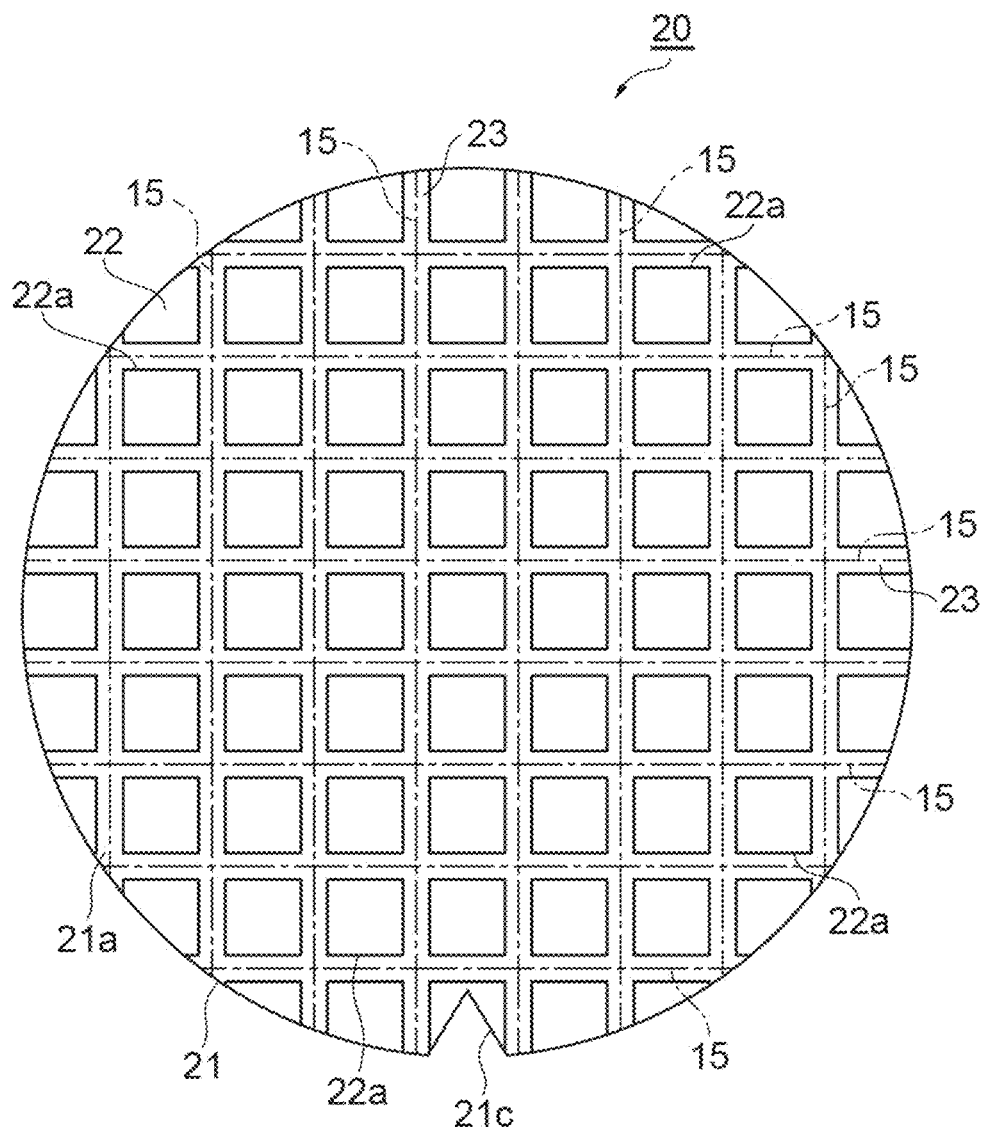
FIG. 2 is a plan view of a wafer of one embodiment.
Figure 3:
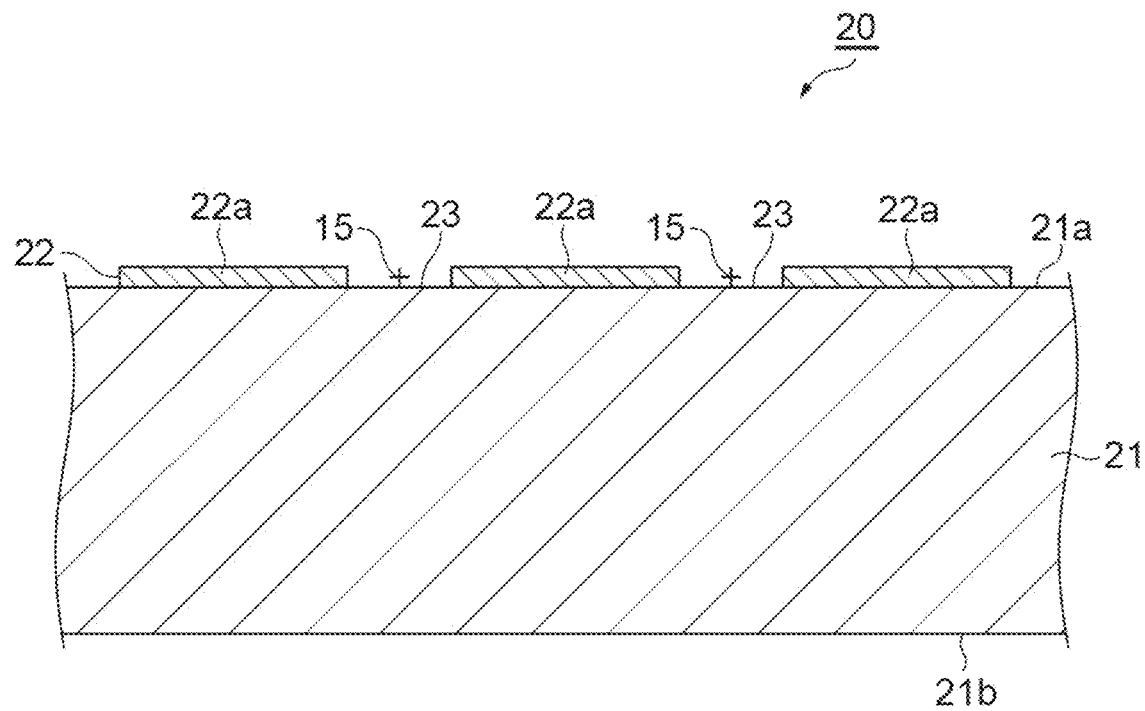
FIG. 3 is a cross-sectional view of a portion of the wafer shown in FIG. 2.

The object 11 of the present embodiment is a wafer 20 as shown in FIGS. 2 and 3. The wafer 20 includes a semiconductor substrate 21 and a functional element layer 22. Incidentally, in the present embodiment, the wafer 20 will be described as including the functional element layer 22; however, the wafer 20 may or may not include the functional element layer 22, and may be a bare wafer. The semiconductor substrate 21 has a surface 21a and a back surface 21b. The semiconductor substrate 21 is, for example, a silicon substrate. The functional element layer 22 is formed on the surface 21a of the semiconductor substrate 21. The functional element layer 22 includes a plurality of functional elements 22a that are two-dimensionally arranged along the surface 21a. Each of the functional elements 22a is, for example, a light-receiving element such as a photodiode, a light-emitting element such as a laser diode, a circuit element such as a memory, or the like. The functional elements 22a may be three-dimensionally configured by being stacked in a plurality of layers. Incidentally, the semiconductor substrate 21 is provided with a notch 21c indicating a crystal orientation, but may be provided with an orientation flat instead of the notch 21c.

The wafer 20 is cut along each of a plurality of lines 15 into each of the functional elements 22a. The plurality of lines 15 pass through respective spaces between the plurality of functional elements 22a when viewed in a thickness direction of the wafer 20. More specifically, the lines 15 pass through the centers (centers in a width direction) of street regions 23 when viewed in the thickness direction of the wafer 20. The street region 23 extends to pass through the space between the functional elements 22a adjacent to each other in the functional element layer 22. In the present embodiment, the plurality of functional elements 22a are arranged in a matrix pattern along the surface 21a, and the plurality of lines 15 are set in a grid pattern. Namely, in the wafer 20, a plurality of the lines 15 (first lines) extending in the X direction and a plurality of the lines 15 (second lines) extending in the Y direction are set. Incidentally, the lines 15 are imaginary lines, but may be actually drawn lines.

[Configuration of Laser Irradiation Unit]

Figure 4:
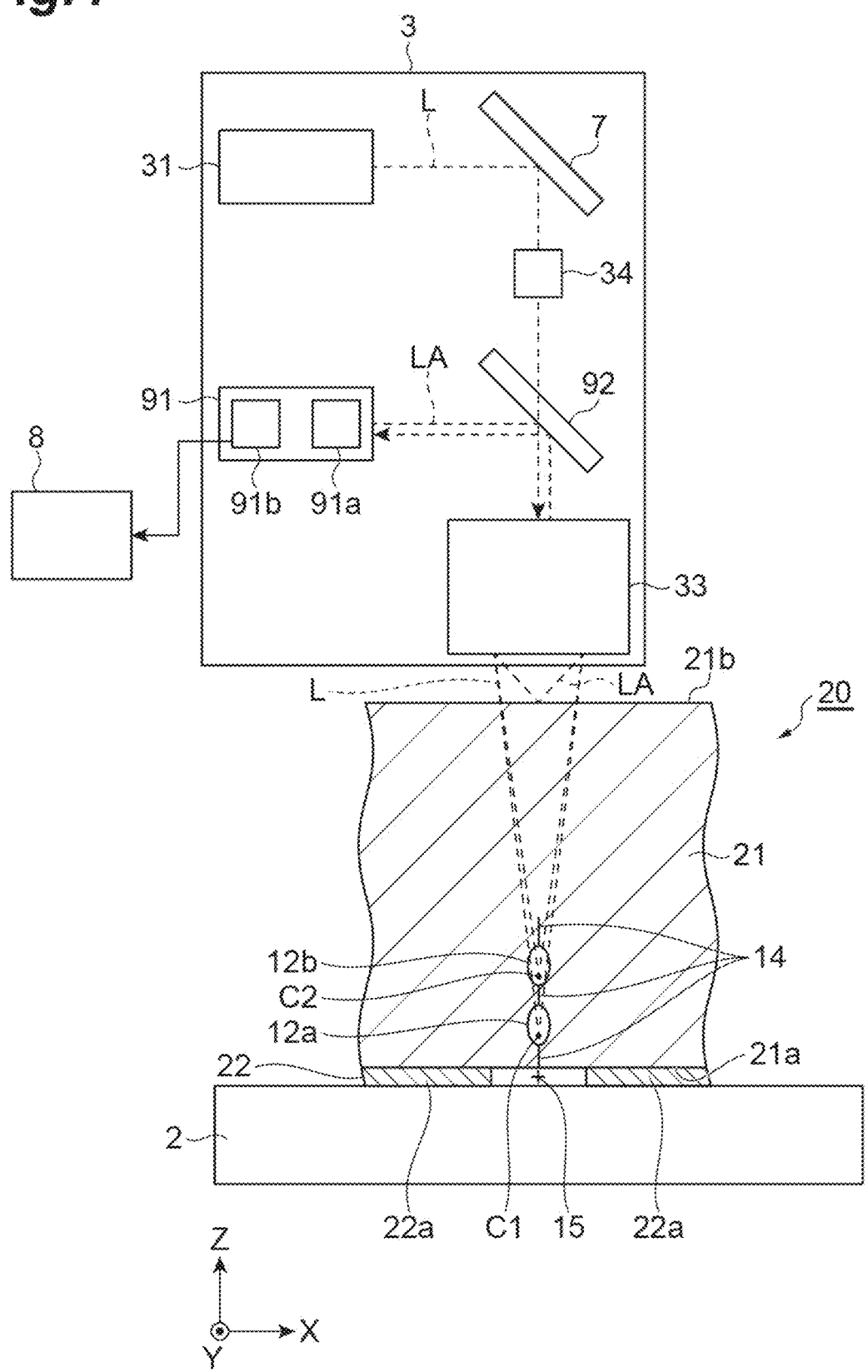
FIG. 4 is a configuration view of a laser irradiation unit shown in FIG. 1.

As shown in FIG. 4, the laser irradiation unit 3 includes a light source 31 (laser irradiation unit), a spatial light modulator 7, a condenser lens 33, and a 4f lens unit 34. The light source 31 outputs the laser beam L, for example, through a pulse oscillation method. The spatial light modulator 7 modulates the laser beam L output from the light source 31. The spatial light modulator 7 is, for example, a reflective liquid crystal on silicon (LCOS)-spatial light modulator (SLM). The condenser lens 33 condenses the laser beam L modulated by the spatial light modulator 7. Incidentally, the condenser lens 33 may be a correction ring lens.

In the present embodiment, the laser irradiation unit 3 forms the modified regions 12 (for example, two rows of modified regions 12a and 12b) inside the semiconductor substrate 21 along each of the plurality of lines 15 by irradiating the wafer 20 with the laser beam L from a back surface 21b side of the semiconductor substrate 21 along each of the plurality of lines 15. Of the two rows of modified regions 12a and 12b, the modified regions 12a are modified regions closest to the surface 21a. Of the two rows of modified regions 12a and 12b, the modified regions 12b are modified regions closest to the modified regions 12a, and are modified regions closest to the back surface 21b.

The two rows of modified regions 12a and 12b are adjacent to each other in the thickness direction (Z direction) of the wafer 20. The two rows of modified regions 12a and 12b are formed by moving two condensing spots C1 and C2 relative to the semiconductor substrate 21 along the line 15. For example, the laser beam L is modulated by the spatial light modulator 7 such that the condensing spot C2 is located behind the condensing spot C1 in a traveling direction and on the incident side of the laser beam L. Incidentally, the formation of the modified regions may be performed using a single focal point or multiple focal points, and one row of the modified regions (one pass) may be formed or a plurality of rows of the modified regions (plurality of passes) may be formed along one planned cutting line.

Such formation of the two rows of modified regions 12a and 12b and cracks 14 is performed in the following case. Namely, the case is that, for example, by grinding the back surface 21b of the semiconductor substrate 21 in a later step, the semiconductor substrate 21 is thinned and the cracks 14 are exposed on the back surface 21b to cut the wafer 20 into a plurality of semiconductor devices along each of the plurality of lines 15.

Figure 5:
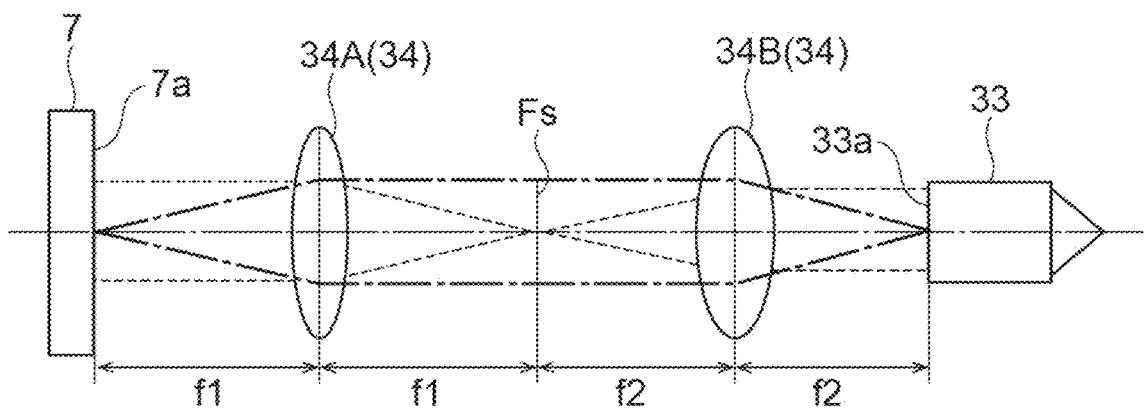
FIG. 5 is a view showing a 4$f$ lens unit shown in FIG. 4.

As shown in FIG. 5, the 4f lens unit 34 includes a pair of lenses 34A and 34B arranged on an optical path of the laser beam L from the spatial light modulator 7 toward the condenser lens 33. The pair of lenses 34A and 34B constitute a double-sided telecentric optical system in which a modulation surface 7a of the spatial light modulator 7 and an entrance pupil surface (pupil surface) 33a of the condenser lens 33 are in an image-forming relationship. Accordingly, an image of the laser beam L on the modulation surface 7a of the spatial light modulator 7 (an image of the laser beam L modulated by the spatial light modulator 7) is transferred (formed) onto the entrance pupil surface 33a of the condenser lens 33. Incidentally, Fs in the drawing indicates a Fourier plane.

Figure 6:
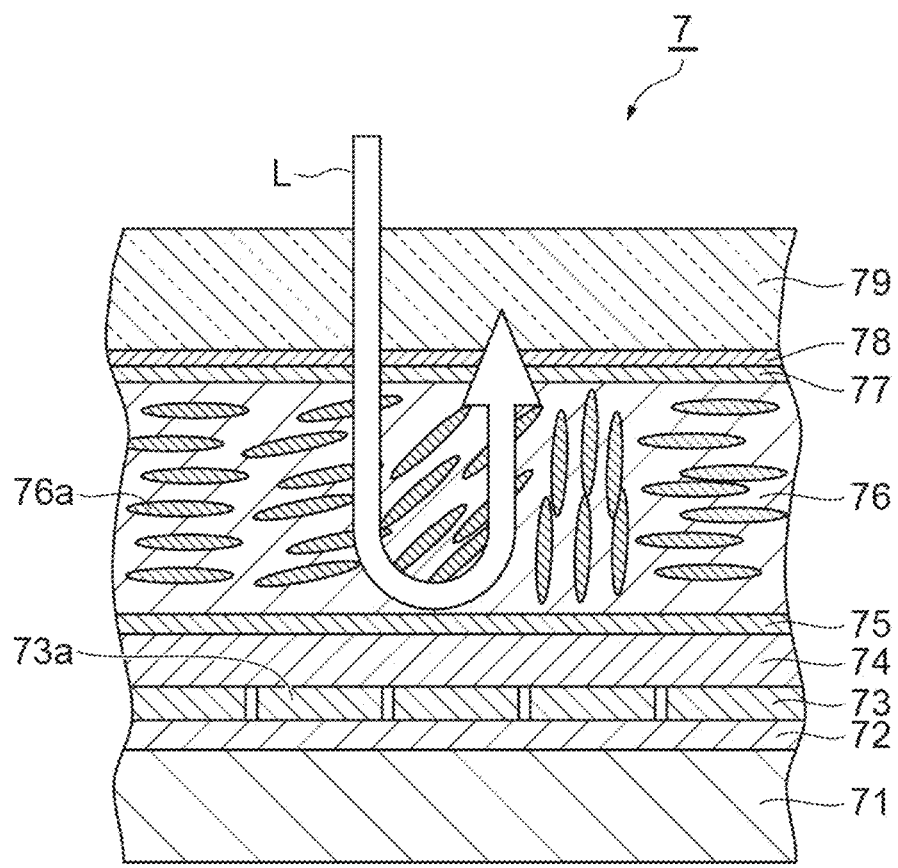
FIG. 6 is a view showing a spatial light modulator shown in FIG. 4.

As shown in FIG. 6, the spatial light modulator 7 is, for example, a reflective liquid crystal on silicon (LCOS)-spatial light modulator (SLM). The spatial light modulator 7 is configured by laminating a drive circuit layer 72, a pixel electrode layer 73, a reflective film 74, an alignment film 75, a liquid crystal layer 76, an alignment film 77, a transparent conductive film 78, and a transparent substrate 79 on a semiconductor substrate 71 in order.

The semiconductor substrate 71 is, for example, a silicon substrate. The drive circuit layer 72 constitutes an active matrix circuit on the semiconductor substrate 71. The pixel electrode layer 73 includes a plurality of pixel electrodes 73a arranged in a matrix pattern along a surface of the semiconductor substrate 71. Each of the pixel electrodes 73a is made of, for example, a metal material such as aluminum. A voltage is applied to each of the pixel electrodes 73a by the drive circuit layer 72.

The reflective film 74 is, for example, a dielectric multilayer film. The alignment film 75 is provided on a surface on a reflective film 74 side of the liquid crystal layer 76, and the alignment film 77 is provided on a surface on an opposite side of the liquid crystal layer 76 from the reflective film 74. Each of the alignment films 75 and 77 is made of, for example, a polymer material such as polyimide, and a contact surface of each of the alignment films 75 and 77 with the liquid crystal layer 76 is subjected to, for example, a rubbing treatment. The alignment films 75 and 77 arrange crystal molecules 76a contained in the liquid crystal layer 76, in a certain direction.

The transparent conductive film 78 is provided on a surface on an alignment film 77 side of the transparent substrate 79, and faces the pixel electrode layer 73 with the liquid crystal layer 76 and the like sandwiched therebetween. The transparent substrate 79 is, for example, a glass substrate. The transparent conductive film 78 is made of, for example, a light-transmissive and conductive material such as ITO. The transparent substrate 79 and the transparent conductive film 78 transmit the laser beam L.

In the spatial light modulator 7 configured as described above, when a signal indicating a modulation pattern is input to the drive circuit layer 72 from the control unit 8, a voltage corresponding to the signal is applied to each of the pixel electrodes 73a, and an electric field is formed between each of the pixel electrodes 73a and the transparent conductive film 78. When the electric field is formed, in the liquid crystal layer 76, the arrangement direction of the crystal molecules 76a changes in each region corresponding to each of the pixel electrodes 73a, and the refractive index changes in each region corresponding to each of the pixel electrodes 73a. This state is a state where the modulation pattern is displayed on the liquid crystal layer 76. The modulation pattern is intended to modulate the laser beam L.

Namely, in a state where the modulation pattern is displayed on the liquid crystal layer 76, when the laser beam L is incident on the liquid crystal layer 76 from the outside through the transparent substrate 79 and the transparent conductive film 78, is reflected by the reflective film 74, and is emitted from the liquid crystal layer 76 to the outside through the transparent conductive film 78 and the transparent substrate 79, the laser beam L is modulated according to the modulation pattern displayed on the liquid crystal layer 76. In such a manner, according to the spatial light modulator 7, the modulation of the laser beam L (for example, the modulation of the intensity, amplitude, phase, polarization, and the like of the laser beam L) can be performed by appropriately setting the modulation pattern displayed on the liquid crystal layer 76. Incidentally, the modulation surface 7a shown in FIG. 5 is, for example, the liquid crystal layer 76.

As described above, the laser beam L output from the light source 31 is incident on the condenser lens 33 through the spatial light modulator 7 and the 4f lens unit 34, and is condensed inside the object 11 by the condenser lens 33, so that the modified region 12 and cracks extending from the modified region 12 are formed at the condensing spot C in the object 11. Further, the control unit 8 controls the stage 2 to move the condensing spot C relative to the wafer 20, so that the modified regions 12 and cracks are formed along a movement direction of the condensing spot C.

As shown in FIG. 4, the laser irradiation unit 3 further includes an autofocus (AF) unit 91 (measurement unit). The AF unit 91 is configured to accurately align the condensing spot of the laser beam L at a position away from the back surface 21b by a predetermined distance, even when there is a displacement (undulation) in the thickness direction (Z direction) on the back surface 21b that is the incident surface of the wafer 20. The AF unit 91 measures a displacement on the back surface 21b (surface to be measured) so as to adjust the condensing spot of the laser beam L with which the wafer 20 is irradiated by the light source 31. Specifically, the AF unit 91 acquires displacement data (measures a displacement) of the back surface 21b by irradiating the back surface 21b with an AF laser beam LA (measurement light) and by receiving and detecting the reflected light of the AF laser beam LA on the back surface 21b.

The AF unit 91 includes an AF light source 91a that outputs the AF laser beam LA, and a displacement detection unit 91b that receives and detects the reflected light of the AF laser beam LA. The AF laser beam LA emitted from the AF light source 91a is reflected by an AF dichroic mirror 92, and the back surface 21b is irradiated with the AF laser beam LA through the condenser lens 33. In such a manner, the wafer 20 is irradiated with the AF laser beam LA and the laser beam L from the same condenser lens 33 (the AF laser beam LA and the laser beam L are coaxial). Then, the reflected light of the AF laser beam LA on the back surface 21b is reflected by the AF dichroic mirror 92 and is detected by the displacement detection unit 91b. The displacement detection unit 91b includes, for example, a quadrant photodiode. The quadrant photodiode is configured to split and receive a condensed image of the reflected light of the AF laser beam LA, and to output voltage values corresponding to the respective amounts of light. Since astigmatism is added to the reflected light of the AF laser beam LA, the shape (vertical length, perfect circle, and horizontal length) of the condensed image changes depending on where the back surface 21b of the wafer 20 is located with respect to the condensing spot of the AF laser beam LA. Namely, the condensed image changes according to the position of the back surface 21b of the wafer 20 with respect to the condensing spot. For this reason, the voltage values output from the quadrant photodiode change according to the position of the back surface 21b of the wafer 20 with respect to the condensing spot of the AF laser beam LA.

The voltage values output from the quadrant photodiode of the displacement detection unit 91b are input to the control unit 8. The control unit 8 calculates a calculated value as position information regarding the position of the back surface 21b of the wafer 20 with respect to the condensing spot of the AF laser beam LA, based on the voltage values output from the quadrant photodiode of the displacement detection unit 91b. Then, the control unit 8 controls the drive unit 9 (actuator), based on the calculated value, to finely adjust the position of the condenser lens 33 in an up-down direction such that the position of the condensing spot of the laser beam L with which irradiation is performed by the light source 31 is at a constant depth from the back surface 21b. In such a manner, control based on the distance measurement result by the AF unit 91 is performed together with laser processing by the laser beam L (prior to laser processing), so that even when there is an undulation on the back surface 21b which is the incident surface, the condensing spot of the laser beam L can be accurately aligned at the position away from the back surface 21b by the predetermined distance.

[Configuration of Imaging Unit for Inspection]

Figure 7:
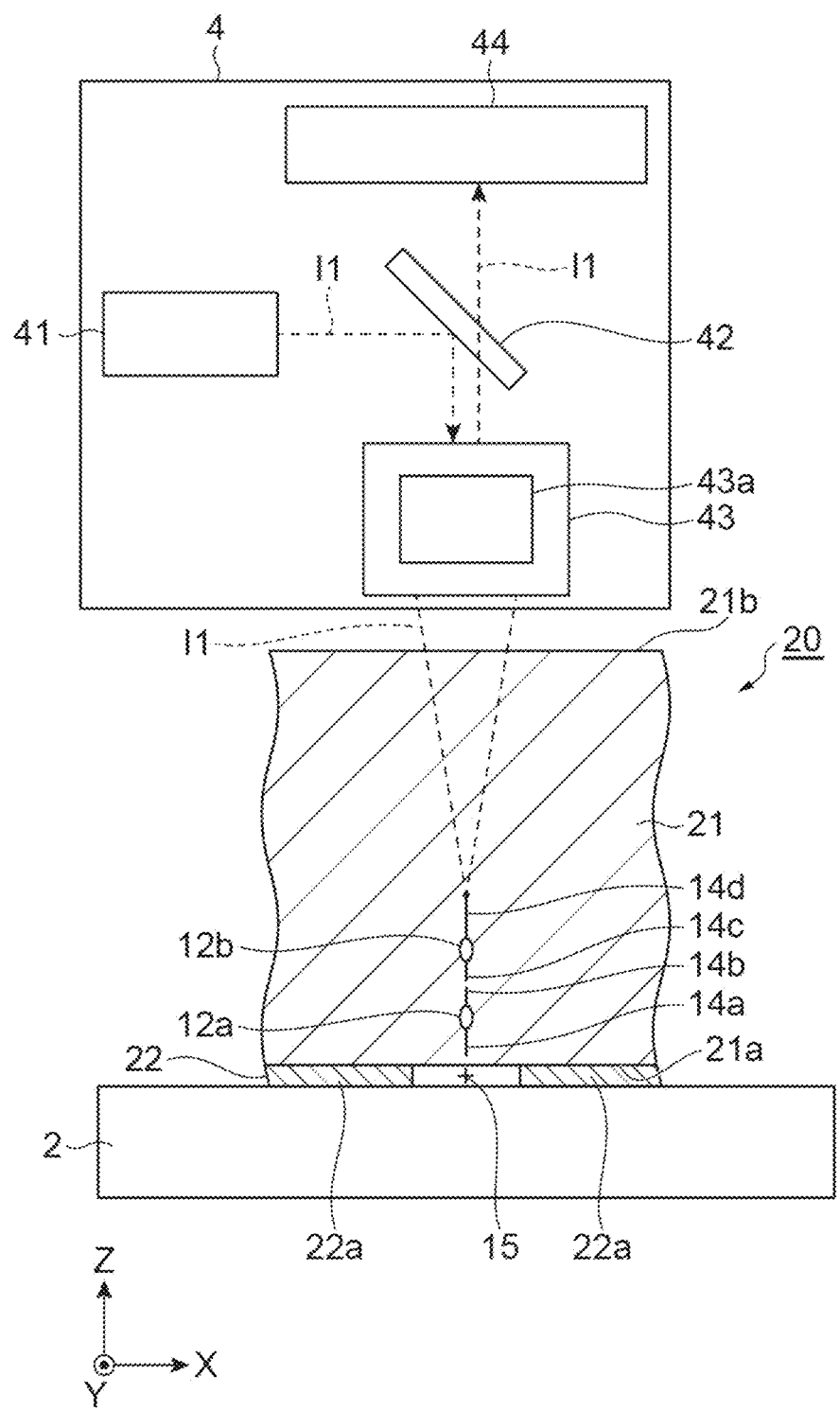
FIG. 7 is a configuration view of an imaging unit for inspection shown in FIG. 1.

As shown in FIG. 7, the imaging unit 4 includes a light source 41, a mirror 42, an objective lens 43, and a light detection unit 44. The imaging unit 4 captures an image of the wafer 20. The light source 41 outputs light I1 having the property of transmitting through the semiconductor substrate 21. The light source 41 is composed of, for example, a halogen lamp and a filter, and outputs the light I1 in the near-infrared region. The light I1 output from the light source 41 is reflected by the mirror 42 and passes through the objective lens 43, and the wafer 20 is irradiated with the light I1 from the back surface 21b side of the semiconductor substrate 21. At this time, the stage 2 supports the wafer 20 in which the two rows of modified regions 12a and 12b are formed as described above.

The objective lens 43 passes the light I1 reflected by the surface 21a of the semiconductor substrate 21. Namely, the objective lens 43 passes the light I1 that has propagated through the semiconductor substrate 21. A numerical aperture (NA) of the objective lens 43 is, for example, 0.45 or more. The objective lens 43 includes a correction ring 43a. For example, the correction ring 43a corrects an aberration occurring in the light I1 inside the semiconductor substrate 21 by adjusting the distance between a plurality of lenses constituting the objective lens 43. Incidentally, means for correcting an aberration is not limited to the correction ring 43a, and may be other correction means such as a spatial light modulator. The light detection unit 44 detects the light I1 that has transmitted through the objective lens 43 and the mirror 42. The light detection unit 44 is configured as, for example, an InGaAs camera, and detects the light I1 in the near-infrared region. Incidentally, means for detecting (capturing an image) the light I1 in the near-infrared region is not limited to the InGaAs camera, and may be other imaging means such as a transmission confocal microscope as long as the other imaging means perform transmission imaging.

The imaging unit 4 can capture an image of each of the two rows of modified regions 12a and 12b and a tip of each of a plurality of cracks 14a, 14b, 14c, and 14d. The crack 14a is a crack extending from the modified region 12a toward a surface 21a side. The crack 14b is a crack extending from the modified region 12a toward the back surface 21b side. The crack 14c is a crack extending from the modified region 12b toward the surface 21a side. The crack 14d is a crack extending from the modified region 12b toward the back surface 21b side.

[Configuration of Imaging Unit for Alignment Correction]

Figure 8:
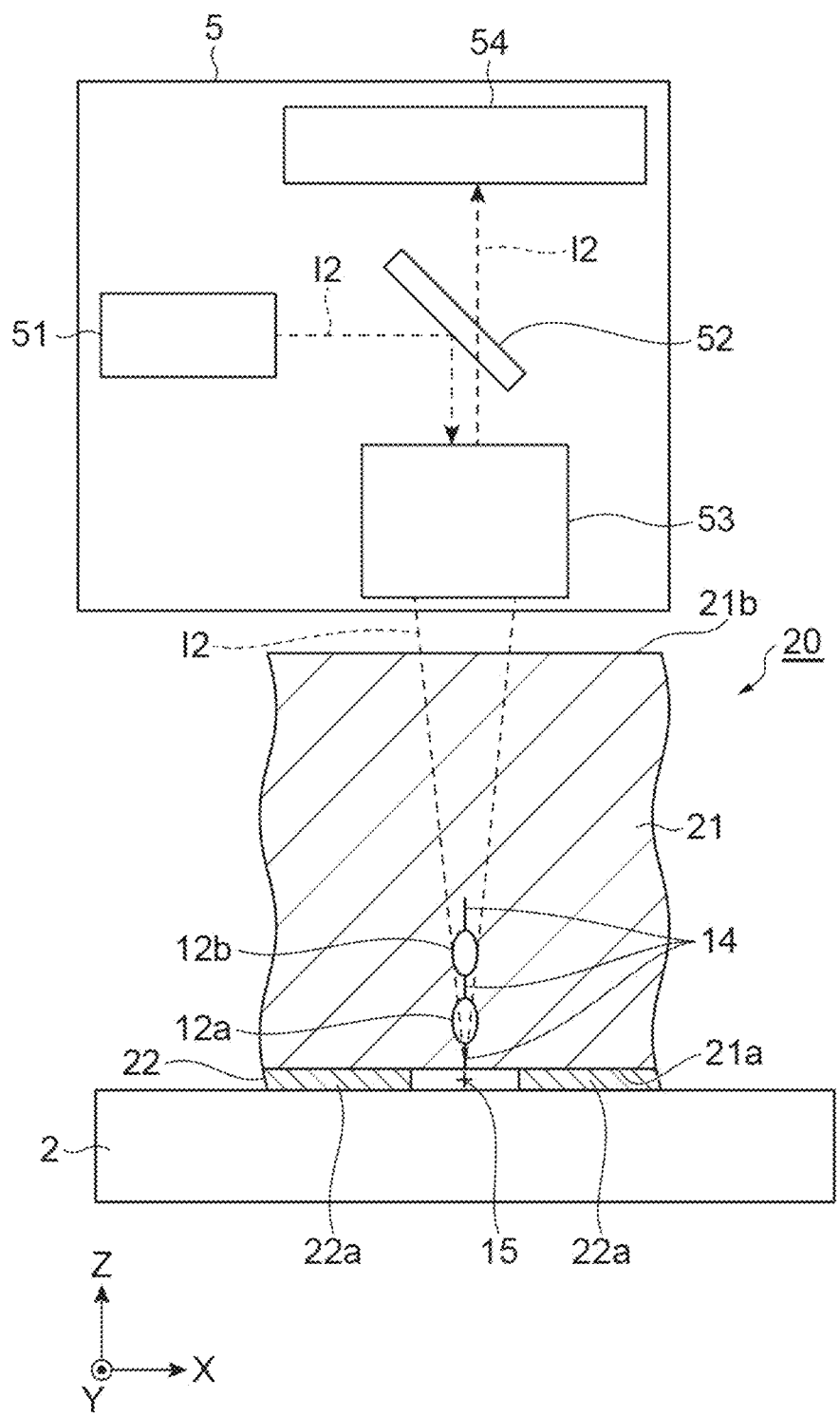
FIG. 8 is a configuration view of an imaging unit for alignment correction shown in FIG. 1.

As shown in FIG. 8, the imaging unit 5 includes a light source 51, a mirror 52, a lens 53, and a light detection unit 54. The light source 51 outputs light I2 having the property of transmitting through the semiconductor substrate 21. The light source 51 is composed of, for example, a halogen lamp and a filter, and outputs the light 12 in the near-infrared region. The light source 51 may be made common with the light source 41 of the imaging unit 4. The light 12 output from the light source 51 is reflected by the mirror 52 and passes through the lens 53, and the wafer 20 is irradiated with the light 12 from the back surface 21b side of the semiconductor substrate 21.

The lens 53 passes the light 12 reflected by the surface 21a of the semiconductor substrate 21. Namely, the lens 53 passes the light 12 that has propagated through the semiconductor substrate 21. A numerical aperture of the lens 53 is 0.3 or less. Namely, the numerical aperture of the objective lens 43 of the imaging unit 4 is larger than the numerical aperture of the lens 53. The light detection unit 54 detects the light 12 that has passed through the lens 53 and the mirror 52. The light detection unit 54 is configured as, for example, an InGaAs camera, and detects the light 12 in the near-infrared region. Incidentally, the light detection unit 54 may be an SD camera, and may detect non-transmissive light.

Under control of the control unit 8, the imaging unit 5 captures an image of the functional element layer 22 by irradiating the wafer 20 with the light 12 from the back surface 21b side and by detecting the light 12 returning from the surface 21a (functional element layer 22). In addition, similarly, under control of the control unit 8, the imaging unit 5 acquires an image of a region including the modified regions 12a and 12b by irradiating the wafer 20 with the light 12 from the back surface 21b side and by detecting the light 12 returning from the formation positions of the modified regions 12a and 12b on the semiconductor substrate 21. These images are used to align the irradiation positions of the laser beam L. The imaging unit 6 has the same configuration as that of the imaging unit 5 except that the lens 53 has a lower magnification (for example, the lens of the imaging unit 5 has a magnification of 6, and the lens of the imaging unit 6 has a magnification of 1.5), and is used for alignment similarly to the imaging unit 5.

[Details of Laser Processing Method]

Hereinafter, details of a laser processing method performed by the laser processing device 1 will be described. In the laser processing method according to the present embodiment, the laser processing of the wafer 20 is performed by irradiating the wafer 20 with the laser beam L using the back surface 21b of the wafer 20 (object) as an incident surface, the wafer 20 including the back surface 21b (first surface) and the surface 21a (second surface) opposite to the back surface 21b. This laser processing method includes a first step and a second step performed after the first step. As described above, the wafer 20 is cut along each of the plurality of lines 15 into each of the functional elements 22a. In the first step, laser irradiation is performed along each of the plurality of lines 15 (first lines, refer to FIG. 2) extending in the X direction (first direction) along the back surface 21b. In the second step, laser irradiation is performed along each of the plurality of lines 15 (second lines, refer to FIG. 2) extending in the Y direction (second direction) along the back surface 21b. Hereinafter, the processing of the first step and the processing of the second step may be described as CH1 processing and CH2 processing, respectively.

In detail, in the processing of the first step (CH1 processing), while moving the condensing spot of the laser beam L relative to the wafer 20 along each of the plurality of lines 15 extending in the X direction, irradiation with the laser beam L is performed to form the modified regions 12 (first modified regions) for division and the cracks 14 extending from the modified regions 12 in the direction of the surface 21a inside the wafer 20. The control unit 8 controls the laser irradiation unit 3 to form such cracks 14 (first control). Here, in the first step, the modified regions 12 are formed to establish a so-called bottom side half-cut (BHC) state where the cracks 14 reach the surface 21a. Incidentally, in the first step, the modified regions 12 may be formed to establish a so-called stealth (ST) state where the cracks 14 do not reach the surface 21a. In addition, in the processing of the second step (CH2 processing), while moving the condensing spot of the laser beam L relative to the wafer 20 along each of the plurality of lines 15 extending in the Y direction, irradiation with the laser beam L is performed to form the modified regions 12 (second modified regions) for division and the cracks 14 extending from the modified regions 12 in the direction of the surface 21a inside the wafer 20. The control unit 8 controls the laser irradiation unit 3 to form such cracks 14 (second control). Here, in the second step, the modified regions 12 are formed to establish the so-called BHC state where the cracks 14 reach the surface 21a. Incidentally, in the second step, the modified regions 12 may be formed to establish the so-called ST state where the cracks 14 do not reach the surface 21a.

Here, as in the CH1 processing and the CH2 processing described above, when the formation of the modified regions 12 is sequentially performed along the plurality of lines 15 intersecting each other, warpage occurs in the wafer 20 due to the formation of the modified regions 12 along the lines 15 (first lines) extending in the X direction and irradiated with the laser beam L earlier. FIG. 9 is a view describing the principle of occurrence of warpage in the wafer 20. Specifically, as shown in FIG. 9, the warpage of the wafer 20 occurs due to the concentration of stress on one side (here, the surface 21a that the cracks 14 reach) of the wafer 20 caused by the formation of the modified regions 12 and the formation of the cracks 14 extending from the modified regions 12 in the direction of the surface 21a. In the example shown in FIG. 9, in the CH1 processing, the modified regions 12 are sequentially formed along the plurality of lines 15 (first lines) extending in the X direction and adjacent to each other in the Y direction, and the cracks 14 extend in the direction of the surface 21a, so that the amount of warpage becomes large particularly on both end portion sides of the wafer 20 in the Y direction. Namely, due to the CH1 processing, warpage occurs in the Y direction that is the processing progress direction in the CH2 processing. Such warpage of the wafer 20 becomes particularly noticeable when the wafer 20 is a microchip or when relatively large cracks 14 are formed in the wafer 20.

Figure 10:
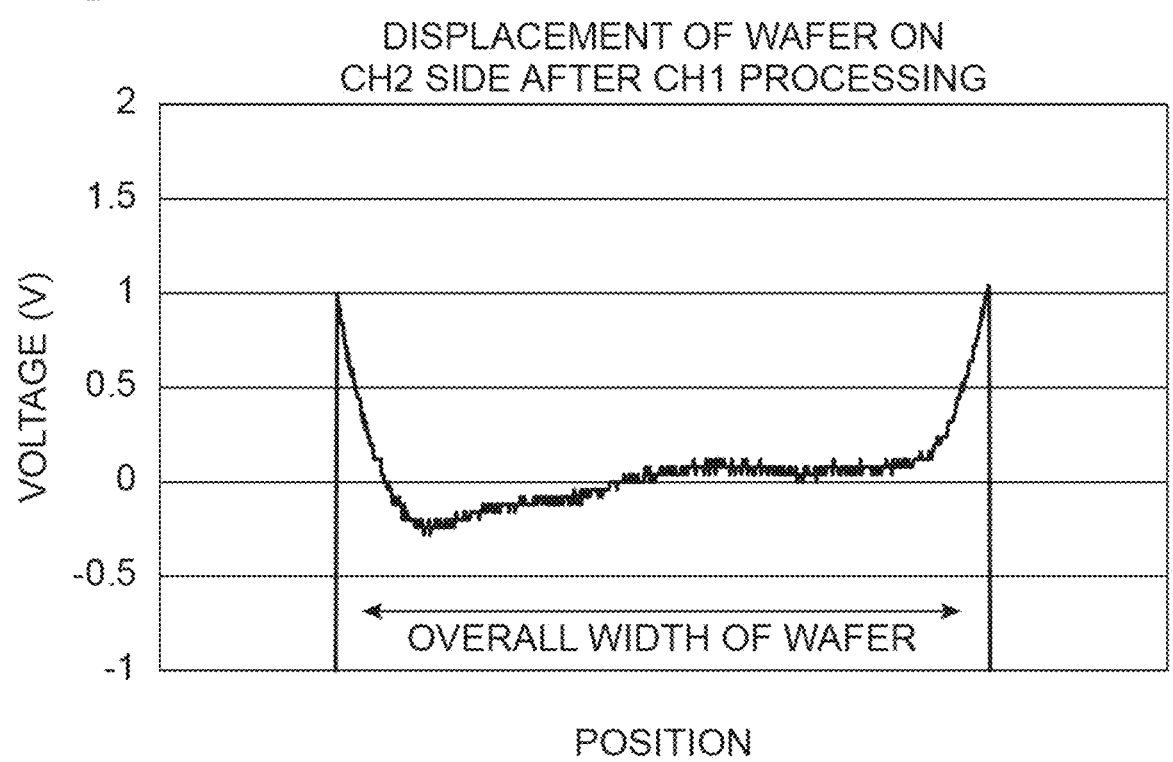
FIG. 10 is a view showing warpage in a CH2 processing progress direction after CH1 processing.

FIG. 10 is a view showing warpage in the CH2 processing progress direction after the CH1 processing and before the CH2 processing. In FIG. 10, the horizontal axis represents the CH2 processing progress direction (width direction of the wafer 20), and the vertical axis represents the displacement amount shown in voltage value. A voltage value of 1V on the vertical axis corresponds to, for example, a displacement amount of approximately 8 μm. FIG. 10 shows one example of the result when the CH1 processing is performed under the conditions of workpiece size: 775 μm (65 mm×36 mm fragment), chip size: 1 mm, finish thickness after grinding: 80 μm, modified region for division: three passes (total crack: approximately 300 μm, BHC crack: approximately 80 μm), and measurement point: located at 1.5 mm from an end portion of the fragment. As is clear from FIG. 10, after the CH1 processing, the amount of warpage becomes large at both end portions (wafer edge portions) in the CH2 processing progress direction.

Figure 11:
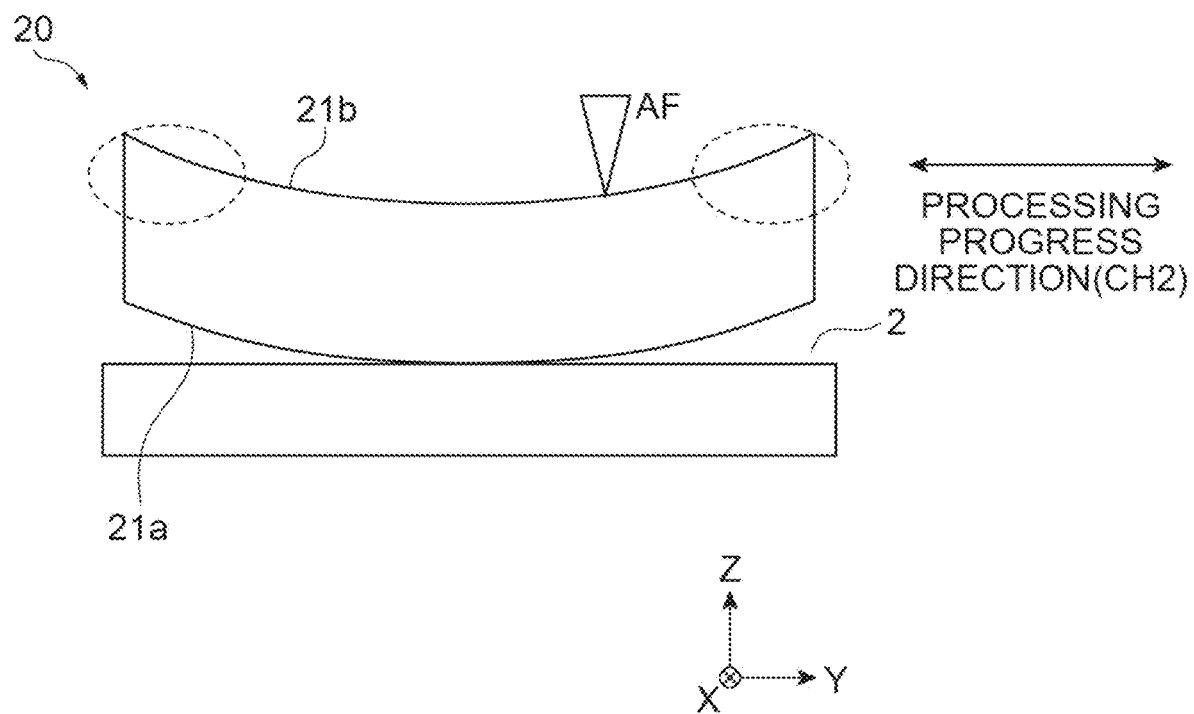
FIG. 11 is a view describing an autofocus (AF) follow-up failure during CH2 processing.

FIG. 11 is a view describing an autofocus (AF) follow-up failure during the CH2 processing after the CH1 processing. As described above, in the laser irradiation unit 3, the AF unit 91 acquires displacement data of the back surface 21b by detecting the reflected light from the back surface 21b. However, the amount of warpage becomes large at the wafer edge portions after the CH1 processing as described above, so that an AF follow-up failure occurs, and accurate displacement data of the back surface 21b cannot also be acquired by the AF unit 91, which is a risk. Accordingly, the accuracy of forming the modified regions 12 (second modified regions) during the CH2 processing deteriorates, which is a risk.

Therefore, in the laser processing method according to the present embodiment, a third step related to suppressing warpage is performed before the second step. In the third step, before the second step, irradiation with the laser beam L is performed to form the modified regions 12 (third modified regions) for suppressing warpage and cracks 114 (refer to FIG. 12) inside the wafer 20, the cracks 114 being formed to reach the back surface 21b, which is the incident surface, from the modified regions 12 and not to be continuous with the cracks 14 extending from the modified regions 12 for division. In this case, the control unit 8 controls the laser irradiation unit 3 to perform irradiation with the laser beam L such that a plurality of the modified regions 12 for suppressing warpage are formed and the cracks 114 extending from the modified regions 12 are formed to reach the back surface 21b and not to be continuous with the cracks 14 extending from the modified regions 12 for division (third control).

Figure 12:
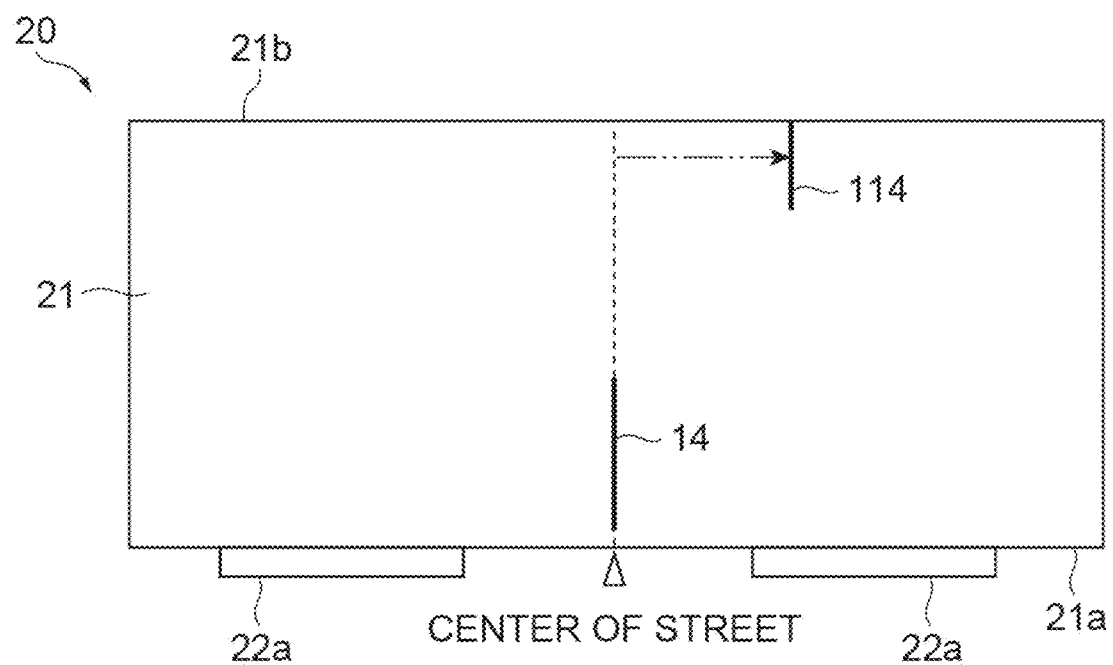
FIG. 12 is a view describing the formation of modified regions for suppressing warpage.

FIG. 12 is a view describing the formation of the modified region 12 for suppressing warpage. As shown in FIG. 12, in the CH1 processing, the modified region 12 for division is formed, and the crack 14 is formed from the modified region 12 in the direction of the surface 21a. In the CH1 processing, the modified region 12 for division and the crack 14 extending from the modified region 12 are formed, for example, at the center of the street region 23 in which the line 15 (first line) extending in the X direction is formed. In this case, in the third step, as shown in FIG. 12, the modified region 12 for suppressing warpage (the modified region 12 related to the crack 114) is formed at a position different from that of the modified region 12 for division (modified region 12 related to the crack 14) in the Y direction (position shifted from the modified region 12 for division). Namely, in the third control, the control unit 8 controls the laser irradiation unit 3 to form the modified region 12 for suppressing warpage at a position different from the formation position of the modified region 12 for division in the Y direction. In the third step, the modified region 12 for suppressing warpage is formed to establish a so-called half-cut (HG) state where the crack 114 reaches the back surface 21b. In such a manner, warpage originating from the modified region 12 for suppressing warpage occurs due to the HC state being established, so that warpage originating from the modified region 12 for division can be further reduced (details will be described later). The method for causing a shift between the position of the modified region 12 for division and the position of the modified region 12 for suppressing warpage (and between the position of the crack 14 and the position of the crack 114) is not limited, and is performed, for example, by the operation of the stage 2 or a Y shift pattern (details will be described later) of the spatial light modulator 7.

Figure 13:
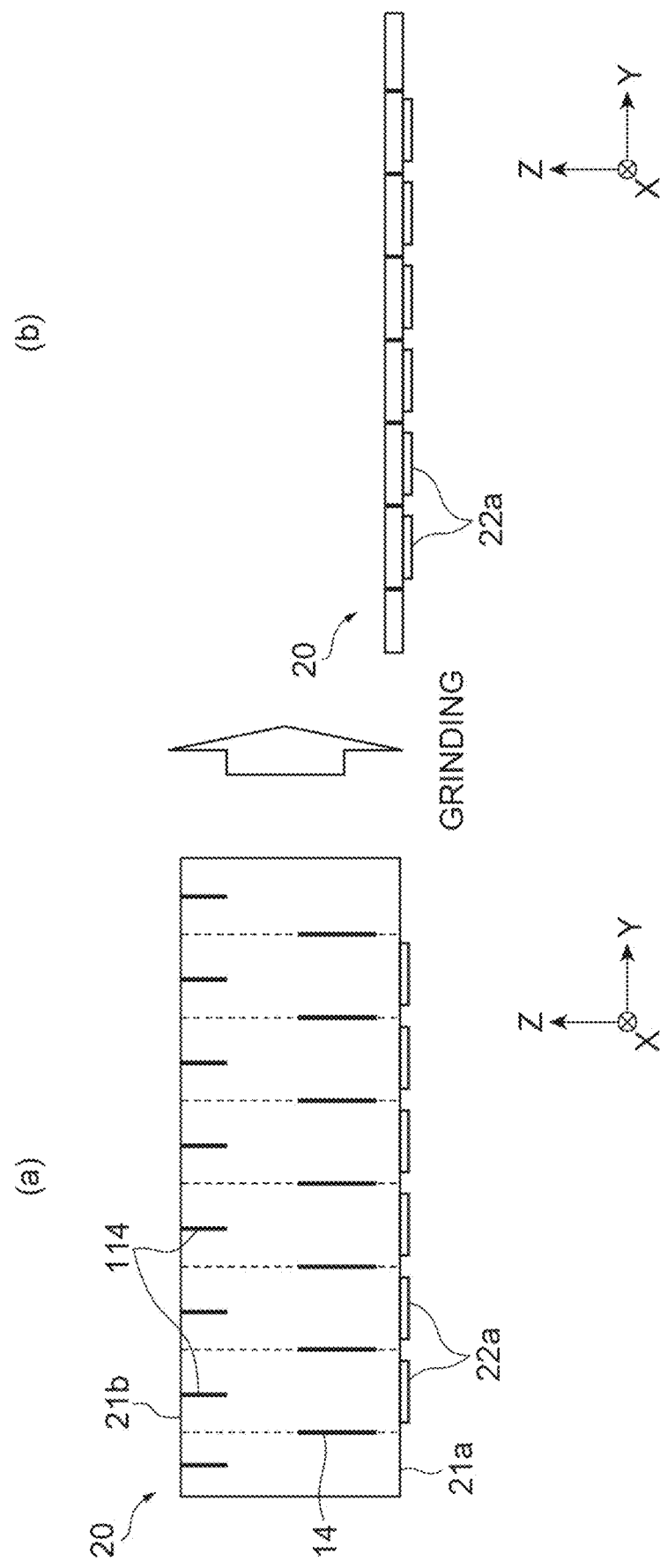
FIG. 13 is a view describing the formation of the modified regions for suppressing warpage in the vicinities of the center positions of chips.

In the third step, the modified region 12 for suppressing warpage may be formed at an intermediate position in the Y direction between the respective formation positions of two lines 15 (first lines) adjacent to each other in the Y direction. In this case, in the third control, the control unit 8 controls the laser irradiation unit 3 to form the modified region 12 for suppressing warpage at the intermediate position in the Y direction between the respective formation positions of the two lines 15 (first lines) adjacent to each other in the Y direction. As described above, in the CH1 processing, the modified regions 12 for division and the cracks 14 extending from the modified regions 12 are formed along the lines 15 (first lines) adjacent to each other in the Y direction and extending in the X direction. For this reason, the intermediate position in the Y direction between the respective formation positions of the two lines 15 adjacent to each other in the Y direction is the center position of the chip after cutting (division). FIG. 13 is a view describing the formation of the modified regions 12 for suppressing warpage in the vicinities of the center positions of the chips. In the third step, the modified regions 12 for suppressing warpage are formed at the center positions of the chips, so that the separation distance between the cracks 14 extending from the modified regions 12 for division and the cracks 14 extending from the modified regions 12 for suppressing warpage can be maximized, and the risk of wafer cracking caused by the continuity of these cracks can be reduced. Incidentally, as shown in FIG. 13(a), since the vicinities of the center positions of the chips in which the modified regions 12 for suppressing warpage are located above the functional elements 22a, the modified regions 12 for suppressing warpage are formed on active regions; however, since the distance from the condensing spots to the functional elements 22a can be made sufficiently long in the third step, the functional elements 22a are not damaged by escape light related to laser irradiation in the third step. Then, as shown in FIG. 13(b), since the modified regions 12 for suppressing warpage are removed in later grinding, even when the modified regions 12 for suppressing warpage are formed on the active regions in the third step, the modified regions 12 for suppressing warpage do not affect the semiconductor devices that are made into chips.

Figure 14:
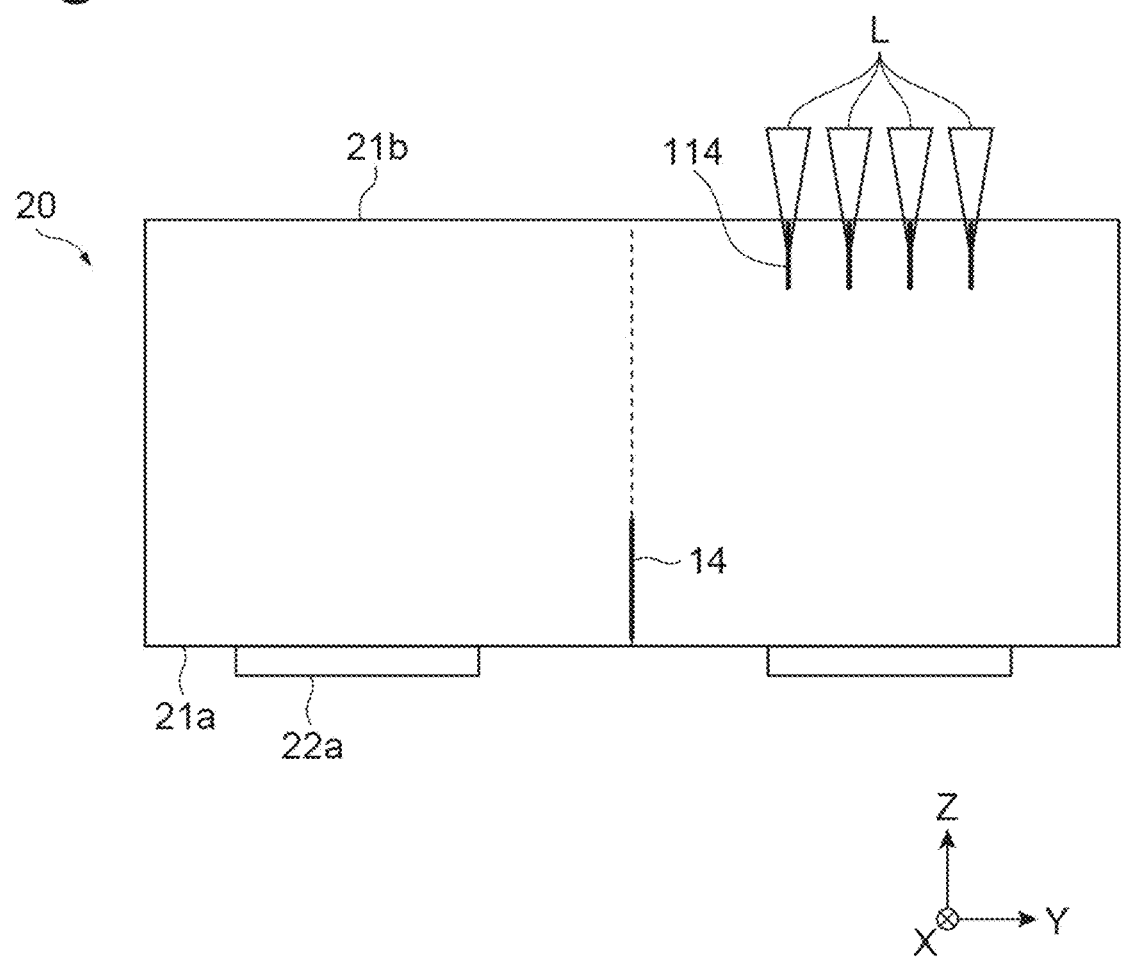
FIG. 14 is a view describing the formation of the modified regions for suppressing warpage through multi-point branching.

In the third step, the cracks 114 extending from the modified regions 12 for suppressing warpage may be formed such that the cracks 114 are shorter than the cracks 14 extending from the modified regions 12 for division. Further, in the third step, while shortening the length of the cracks 114 as described above, a larger number of the modified regions 12 for suppressing warpage than the modified regions 12 for division may be formed in the second direction. FIG. 14 is a view describing the formation of the modified regions for suppressing warpage through multi-point branching. As a processing method for increasing the number of the modified regions 12 for suppressing warpage while shortening the length of the cracks 114 extending from the modified regions 12 for suppressing warpage, for example, the multi-point branching using a modulation pattern (multi-point branching pattern) set in the spatial light modulator 7 may be performed. In this case, the control unit 8 sets the modulation pattern (multi-point branching pattern) in the spatial light modulator 7 such that the cracks 114 are shorter than the cracks 14 and a larger number of the modified regions 12 for suppressing warpage than the modified regions 12 for division are formed. As shown in FIG. 14, a large number of the modified regions 12 for suppressing warpage are formed at once by the multi-point branching using the spatial light modulator 7. In addition, the crack 114 can be shortened in the vertical direction (the risk of wafer cracking can be reduced) by increasing the number of the condensing spots and by dispersing energy. In such a manner, according to the multi-point branching using the modulation pattern (multi-point branching pattern) set in the spatial light modulator 7, warpage suppression processing that reduces the risk of wafer cracking can be performed without reducing the tact time. Incidentally, the method for making the cracks 114 shorter than the cracks 14 and forming a larger number of the modified regions 12 for suppressing warpage than the modified regions 12 for division is not limited to the multi-point branching using the spatial light modulator 7, and for example, processing may be performed line by line while feeding the table.

In the third step, the modified regions 12 for suppressing warpage may be formed to mainly suppress warpage at an outer peripheral portion of the wafer 20 (wafer edge portions that are both end portions in the CH2 processing progress direction) at which the amount of warpage becomes large. FIG. 15 is a view describing a processing method for mainly suppressing warpage at the outer peripheral portion of the wafer 20. As shown in FIG. 15(a), in the third step, when the modified regions 12 for suppressing warpage at a central portion of the wafer 20 in the Y direction are compared to the modified regions 12 for suppressing warpage at both end portions, the modified regions 12 for suppressing warpage may be formed by changing the processing index depending on the location such that the number of the modified regions 12 for suppressing warpage in the second direction is larger at both the end portions. In this case, in the third control, the control unit 8 controls the laser irradiation unit 3 such that the number of the modified regions 12 for suppressing warpage is larger at both the end portions in the Y direction. In addition, as shown in FIG. 15(b), in the third step, when the modified regions 12 for suppressing warpage at the central portion of the wafer 20 in the Y direction are compared to the modified regions 12 for suppressing warpage at both the end portions, the modified regions 12 for suppressing warpage may be formed such that the length of cracks 114L that are the cracks 114 at both the end portions become longer than that of cracks 114S that are the cracks 114 at the central portion. In this case, in the third control, the control unit 8 controls the laser irradiation unit 3 such that the length of the cracks 114 extending from the modified regions 12 for suppressing warpage is larger at both the end portions in the Y direction.

Figure 16:
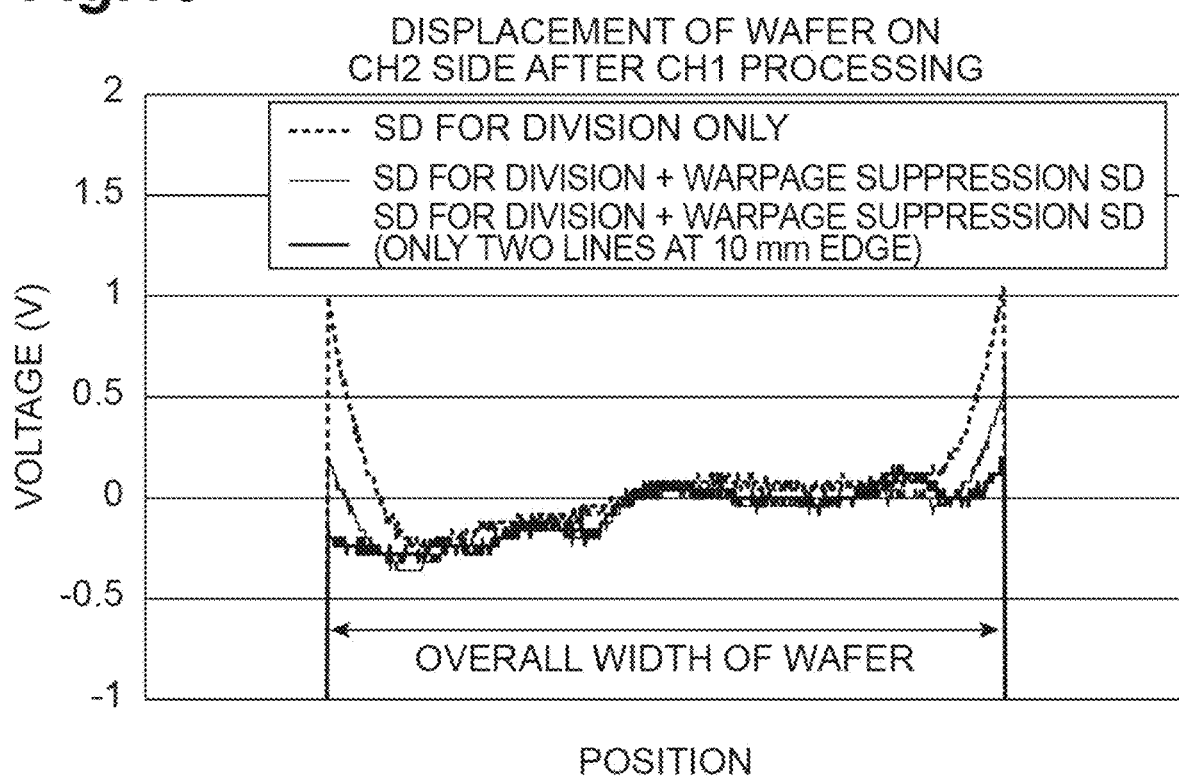
FIG. 16 is a view showing warpage in the CH2 processing progress direction after the CH1 processing for each formation mode of the modified regions for suppressing warpage.

FIG. 16 is a view showing warpage in the CH2 processing progress direction after the CH1 processing for each formation mode of the modified regions for suppressing warpage. In FIG. 16, the horizontal axis represents the CH2 processing progress direction (width direction of the wafer 20), and the vertical axis represents the displacement amount shown in voltage value. A voltage value of 1V on the vertical axis corresponds to, for example, a displacement amount of approximately 8 µm. FIG. 16 shows one example of the results when the CH1 processing is performed under the conditions of workpiece size: 775 µm (65 mm×36 mm fragment), chip size: 1 mm, finish thickness after grinding: 80 µm, modified region for division: three passes (total crack: approximately 300 µm, BHC crack: approximately 80 µm), and measurement point: located at 1.5 mm from an end portion of the fragment. FIG. 16 shows the amount of warpage (displacement amount) for each of the instances when only the modified regions 12 for division are formed (Pattern 1), when the modified regions 12 for division are formed and the same number of the modified regions 12 for suppressing warpage are formed (Pattern 2), and when two lines of the modified regions 12 for suppressing warpage are formed at a 10 mm edge portion that is the outer peripheral portion of the wafer 20, in addition to Pattern 2 (Pattern 3).

As shown in FIG. 16, when Pattern 3 is used, the amount of warpage can be suppressed even at the outer peripheral portion of the wafer 20 at which the amount of warpage is likely to become large.

Incidentally, as shown in FIG. 15(c), in the third step, each of the modified regions 12 for suppressing warpage may be formed such that the modified regions 12 for suppressing warpage at the central portion of the wafer 20 are thinned out. For example, in a case where the amount of warpage is very small at the central portion of the wafer 20, and the amount of warpage is large only at both end portions, even when the modified regions 12 for suppressing warpage at the central portion of the wafer 20 are thinned out, the warpage of the wafer 20 can be appropriately suppressed.

Figure 17:
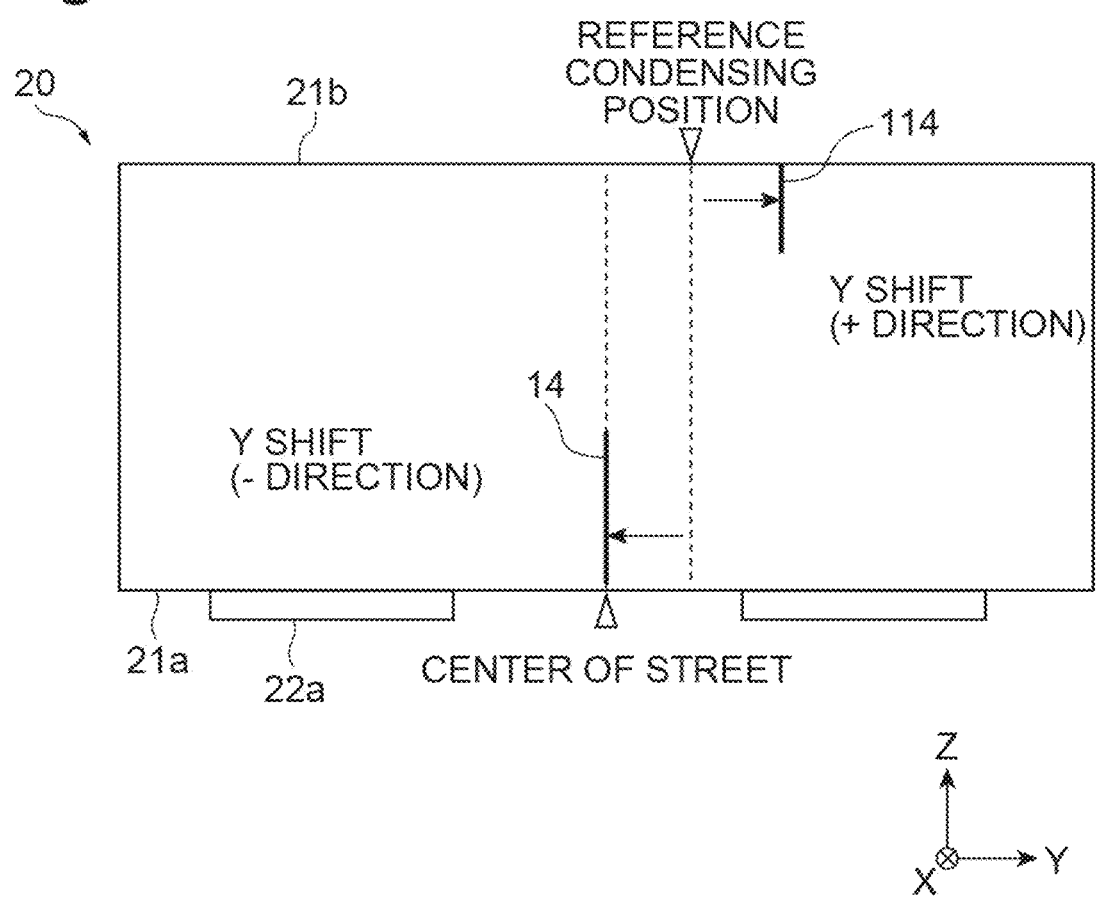
FIG. 17 is a view describing a processing position shift through the setting of a modulation pattern of the spatial light modulator.

In the third step, the modified regions 12 for suppressing warpage may be formed at the positions different from those of the modified regions 12 for division in the Y direction, by setting the modulation pattern (modulation pattern for shifting the condensing spot) of the spatial light modulator 7 that modulates the laser beam L. Namely, in the third control, the control unit 8 may set the modulation pattern such that the modified regions 12 for suppressing warpage are formed at positions different from the formation positions of the modified regions 12 for division in the Y direction. FIG. 17 is a view describing a processing position shift through the setting of the modulation pattern of the spatial light modulator 7. In the example shown in FIG. 17, in the first step, the condensing spot of the modified region 12 for division is shifted from a reference condensing position in a −Y direction, and in the third step, the condensing spot of the modified region 12 for suppressing warpage is shifted from the reference condensing position in a +Y direction. Accordingly, the modified region 12 for division and the modified region 12 for suppressing warpage can be shifted opposite to each other in the Y direction, and the positions of the modified regions 12 and the cracks 14 and 114 extending from the modified regions 12 can be sufficiently separated from each other. Then, in the first step and the third step, since the processing position can be shifted only by switching the modulation pattern, the processing time required for processing can be shortened compared to when the stage 2 is operated.

In at least one of the first step and the third step, the position of an end portion on the back surface 21b side of the crack 14 extending from the modified region 12 for division may be set to differ from the position of an end portion on the surface 21a side on the surface 21a side of the crack 114 extending from the modified region 12 for suppressing warpage, by setting the modulation pattern of the spatial light modulator 7. Namely, in at least one of the first control and the third control, the control unit 8 may set the modulation pattern such that the position of the end portion on the back surface 21b side of the crack 14 extending from the modified region 12 for division is different from the position of the end portion on the surface 21a side of the crack 114 extending from the modified region 12 for suppressing warpage. Here, the position of the end portion on the back surface 21b side of the crack 14 and the position of the end portion on the surface 21a side of the crack 114 will be described as being made different from each other by setting the modulation pattern of the spatial light modulator 7 in the first step. Specifically, in the first step, by forming the crack 14 inclined with respect to the Z direction and the Y direction, the position of the end portion on the back surface 21b side of the crack 14 and the position of the end portion on the surface 21a side of the crack 114 are made different from each other (refer to FIG. 18(a)).

Figure 18:
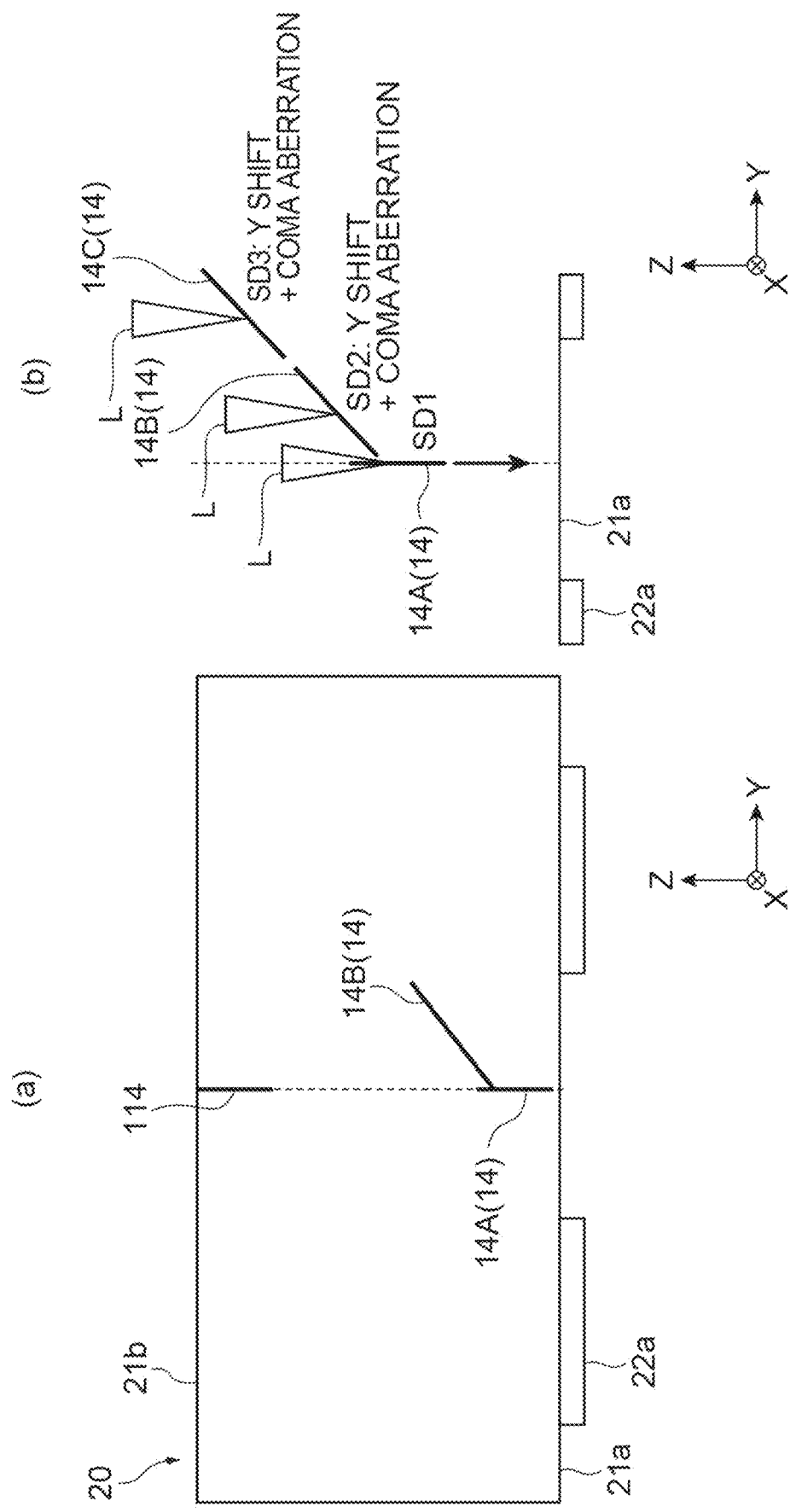
FIG. 18 is a view describing the formation of diagonal cracks through the setting of the modulation pattern of the spatial light modulator.

FIG. 18 is a view describing the formation of diagonal cracks through the setting of the modulation pattern of the spatial light modulator. In the example shown in FIG. 18(*a*), in the first step, two rows of the modified regions 12 for division are formed, a crack 14A extending from the modified region 12 on the surface 21*a* side is formed to extend along the line 15, and a crack 14B extending from the modified region 12 on the back surface 21*b* side is formed as a diagonal crack that is continuous with the crack 14A and that is inclined with respect to the Z direction and the Y direction. Accordingly, for example, as shown in FIG. 18(*a*), in the third step, even when the modified region 12 for suppressing warpage is formed such that the crack 114 is formed at the same position as the crack 14A in the Y direction, the position of the end portion on the back surface 21*b* side of the crack 14 (in detail, the crack 14B) extending from the modified region 12 for division and the position of the end portion on the surface 21*a* side of the crack 114 can be made different from each other. Then, since the crack 14A leading to the crack 14B extends along the line 15, the crack 14 (in detail, the crack 14A) can be appropriately extended to the position and direction required for the crack 14 for division.

In the example shown in FIG. 18(*b*), three rows of the modified regions 12 for division are formed, and the modified region 12 closest to the surface 21*a* side (SD1 in FIG. 18(*b*)) is formed such that the crack 14A extends along the line 15. In addition, through the setting of the modulation pattern of the spatial light modulator 7 (setting of a Y shift and a coma aberration), the modified region 12 in the middle (SD2 in FIG. 18(*b*)) is shifted from SD1 in the Y direction, and the diagonal crack 14B extends therefrom, and the modified region 12 closest to the back surface 21*b* side (SD3 in FIG. 18(*b*)) is further shifted from SD2 in the Y direction, and a diagonal crack 14C extends therefrom. The diagonal crack 14B is continuous with the crack 14A and the diagonal crack 14C, and the diagonal crack 14B and the diagonal crack 14C extend in the same direction (diagonal direction).

Up to this point, in order to suppress the situation where warpage occurs in the wafer 20 due to the processing of the first step (CH1 processing) and adversely affects the processing of the second step (CH2 processing), the formation of the modified regions 12 (third modified regions) for suppressing warpage inside the wafer 20 in the third step before the second step has been described. Here, the warpage of the wafer 20 caused by the formation of the modified regions 12 in the CH1 processing gradually progresses as the formation of the modified regions 12 for division related to the plurality of lines 15 proceeds. For this reason, in the CH1 processing, the processing on the line 15 processed earlier affects the processing on the line 15 processed later. Namely, in the CH1 processing, there is a possibility that in the processing on the lines 15 processed relatively later among the plurality of lines 15, the modified regions 12 for division are formed in a state where the wafer 20 is warped, and in this case, the processing stability deteriorates, which is a risk.

Figure 19:
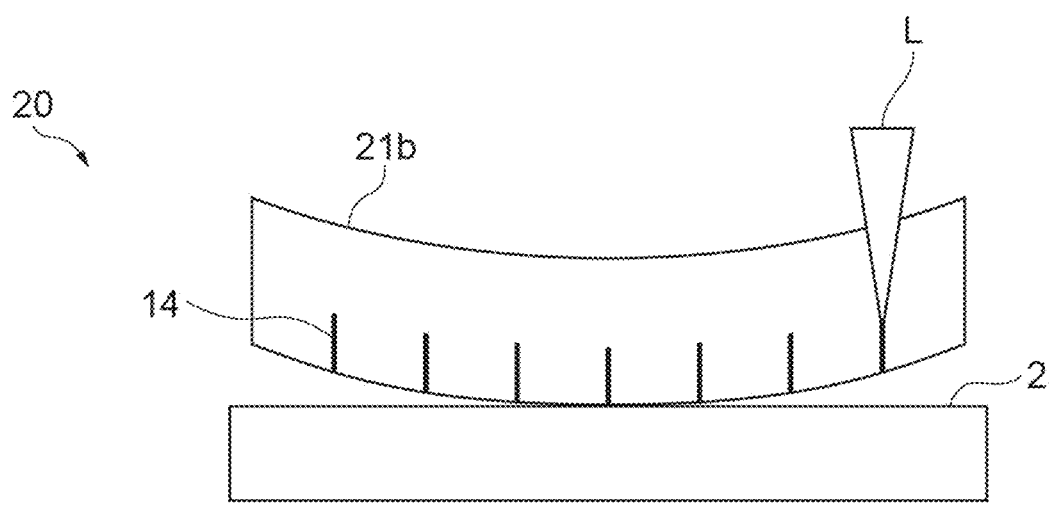
FIG. 19 is a view describing a deterioration in processing stability during the later part of the CH1 processing.

FIG. 19 is a view describing a deterioration in processing stability during the later part of the CH1 processing. As shown in FIG. 19, when the modified regions 12 are already formed for the plurality of lines, and the cracks 14 extend from the modified regions 12, warpage occurs in the wafer 20. In this state, when irradiation with the laser beam L is performed to further form the modified regions 12 for division in the CH1 processing, the cracks 14 extend diagonally with respect to a device surface of the wafer 20, the processing position accuracy deteriorates, and the like, which are problems. In addition, when the wafer 20 is in a warped state, poor suction of the wafer 20 on the stage 2 may occur. In such a manner, during the later part of the CH1 processing, it may be difficult to stably and accurately perform processing.

In view of such circumstances, in the laser processing method according to the present embodiment, the formation of the modified regions 12 for division related to any of the lines 15 in the first step and the formation of the modified regions 12 for suppressing warpage in the third step may be alternately performed. Namely, the control unit 8 controls the laser irradiation unit 3 to alternately perform the formation of the modified regions 12 for division related to any of the lines 15 in the first control and the formation of the modified regions 12 for suppressing warpage in the third control. The term "alternately performing" referred to here includes not only the case of strict one-to-one alternate performing but also the case of alternately performing the formation of a plurality of the modified regions 12 for division and the formation of a plurality of the modified regions 12 for suppressing warpage.

Figure 20:
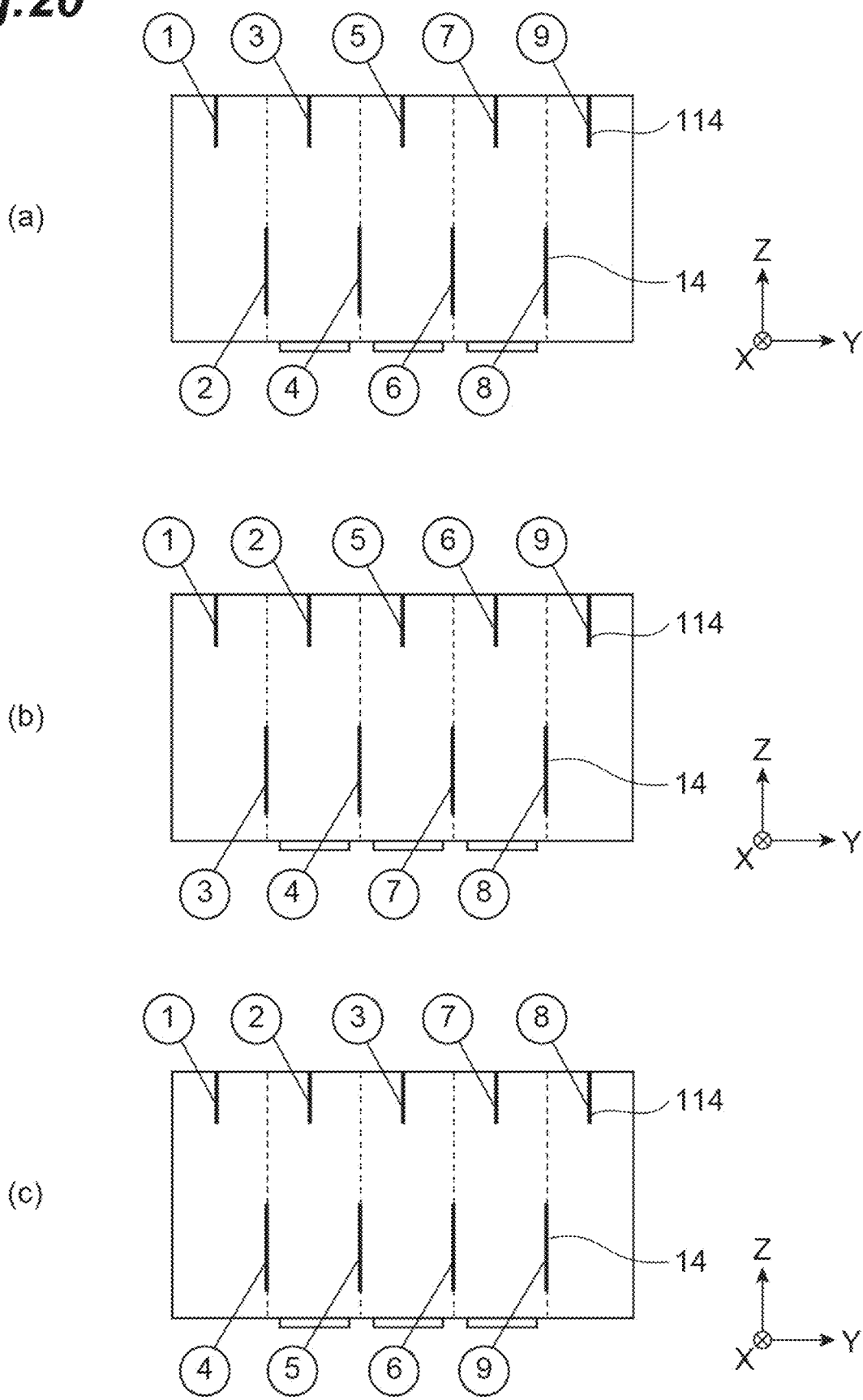
FIG. 20 is a view describing processing methods for alternately forming modified regions for division and the modified regions for suppressing warpage.

FIG. 20 is a view describing processing methods for alternately forming the modified regions 12 for division and the modified regions 12 for suppressing warpage. In FIGS. 20(*a*) to 20(*c*), numbers 1 to 9 indicate processing orders. In the example shown in FIG. 20(*a*), first, the formation of the modified regions 12 for suppressing warpage and the cracks 114 extending from the modified regions 12 is performed in the third step (Processing order 1), and subsequently, the formation of the modified regions 12 for division and the cracks 14 extending from the modified regions 12 is performed in the first step (Processing order 2), and thereafter, the third step and the first step are sequentially performed one by one. In this case, processing locations in each processing are arranged in the sequence of the processing orders in the Y direction. In the example shown in FIG. 20(*b*), first, the formation of the modified regions 12 for suppressing warpage and the cracks 114 extending from the modified regions 12 are performed in two processing stages in the third step (Processing orders 1 and 2), and subsequently, the formation of the modified regions 12 for division and the cracks 14 extending from the modified regions 12 is performed in two processing stages in the first step (Processing orders 3 and 4), and thereafter, such processing is repeatedly performed in pairs. In this case, when looking at each of the first step and the third step individually, processing locations in each processing are arranged in the sequence of the processing orders in the Y direction. In the example shown in FIG. 20(*c*), first, the formation of the modified regions 12 for suppressing warpage and the cracks 114 extending from the modified regions 12 are performed in three processing stages in the third step (Processing orders 1, 2, and 3), and subsequently, the formation of the modified regions 12 for division and the cracks 14 extending from the modified regions 12 is performed in three processing stages in the first step (Processing orders 4, 5, and 6). In this case, when looking at each of the first step and the third step individually, processing locations in each processing are arranged in the sequence of the processing orders in the Y direction.

Incidentally, the influence of earlier processing on later processing in the same step (in the above-described example, the CH1 processing) also occurs in the CH2 processing in the same manner. For this reason, for the purpose of suppressing a deterioration in processing stability during the later part of the CH2 processing, the following fourth step may be further performed. Namely, the laser processing method according to the present embodiment may further include the fourth step of forming a plurality of the modified regions 12 (fourth modified regions) for suppressing warpage and the cracks 114 inside the wafer 20 through irradiation with the laser beam, the cracks 114 being formed to reach the back surface 21b from the modified regions 12 and not to be continuous with the cracks 14 extending from the modified regions 12 for division formed by the CH2 processing. In this case, the formation of the modified regions 12 for division related to any of the lines 15 in the second step and the formation of the modified regions 12 for suppressing warpage in the fourth step may be alternately performed.

Next, actions and effects of the laser processing device 1 according to the present embodiment will be described.

A laser processing device 1 according to the present embodiment includes: a laser irradiation unit 3; and a control unit 8. The control unit 8 is configured to execute a first control to control the laser irradiation unit 3 to form modified regions 12 for division and cracks 14 extending from the modified regions 12 in a direction of a surface 21a inside a wafer 20 by performing irradiation with a laser beam L while moving a condensing spot of the laser beam L relative to the wafer 20 along each of a plurality of lines 15 extending in an X direction along a back surface 21b, a second control to control the laser irradiation unit 3 to form the modified regions 12 for division and the cracks 14 extending from the modified regions 12 in the direction of the surface 21a inside the wafer 20 by performing irradiation with the laser beam L while moving the condensing spot of the laser beam L relative to the wafer 20 along each of a plurality of the lines 15 intersecting the X direction and extending in a Y direction along the back surface 21b, after the first control, and a third control to control the laser irradiation unit 3 to form a plurality of the modified regions 12 for suppressing warpage and cracks 114 extending from the modified regions 12 inside the wafer 20 by performing irradiation with the laser beam L before the second control, the cracks 114 being formed to reach the back surface 21b and not to be continuous with the cracks 14 extending from the modified regions 12 for division.

In the laser processing device 1 according to the present embodiment, irradiation with the laser beam L is performed to form the modified regions 12 for division along each of the plurality of lines 15 extending in the X direction along the back surface 21b, and to form the cracks 14 extending from the modified regions 12 in the direction of the surface 21a, and thereafter, irradiation with the laser beam L is performed to form the modified regions 12 for division along each of the plurality of lines 15 extending in the Y direction, and to form the cracks 14 extending from the modified regions 12 in the direction of the surface 21a. In such a manner, when the formation of the modified regions 12 is sequentially performed along the plurality of lines 15 intersecting each other, warpage occurs in the wafer 20 due to the formation of the modified regions 12 along the lines 15 (first lines) irradiated with the laser beam L earlier (CH1 processing), and due to the influence of the warpage of the wafer 20, the accuracy of the processing on the lines 15 (second lines) irradiated with the laser beam L later deteriorates, which is a risk. Specifically, the warpage of the wafer 20 occurs due to the concentration of stress on one side (here, the surface 21a located in the direction in which the cracks 14 mainly extend) of the wafer 20 caused by the formation of the modified regions 12 and the formation of the cracks 14 extending from the modified regions 12 in the direction of the surface 21a. Such warpage of the wafer 20 becomes particularly noticeable when the wafer 20 is a microchip or when relatively large cracks are formed. Then, in a state where warpage has occurred, when the processing on the lines 15 (second lines) irradiated with the laser beam L later (CH2 processing) is performed, it becomes difficult to ensure the accuracy of autofocus and the like for adjusting the condensing spot of the laser beam L during processing on the lines 15, and the formation of the modified regions 12 is not appropriately performed in the CH2 processing, which is a risk.

In this regard, in the laser processing device 1 according to the present embodiment, prior to control related to the CH2 processing (second control), irradiation with the laser beam L is performed to form the plurality of modified regions 12 for suppressing warpage and the cracks 114 extending from the modified regions 12 inside the wafer 20, the cracks 114 being formed to reach the back surface 21b and not to be continuous with the cracks 14 extending from the modified regions 12 for division. In such a manner, since the modified regions 12 for suppressing warpage are formed such that the cracks 141 reach the back surface 21b opposite to the surface 21a on which stress concentrates due to the formation of the modified regions 12 for division, the localization of stress can be alleviated, and the warpage of the wafer 20 can be reduced. Accordingly, in the CH2 processing performed after the modified regions 12 for suppressing warpage are formed, the modified regions 12 can be appropriately formed. Then, the cracks 141 extending from the modified regions 12 for suppressing warpage are formed not to be continuous with the cracks 14 extending from the modified regions 12 for division, so that the occurrence of unintended cracking of the wafer 20 can be appropriately suppressed by the formation of the modified regions 12 for suppressing warpage. As described above, according to the laser processing device 1 of the present embodiment, while suppressing the occurrence of unintended cracking of the wafer 20, the modified regions 12 for division can be appropriately formed on the wafer 20, so that the accuracy of laser processing can be improved.

Figure 21:
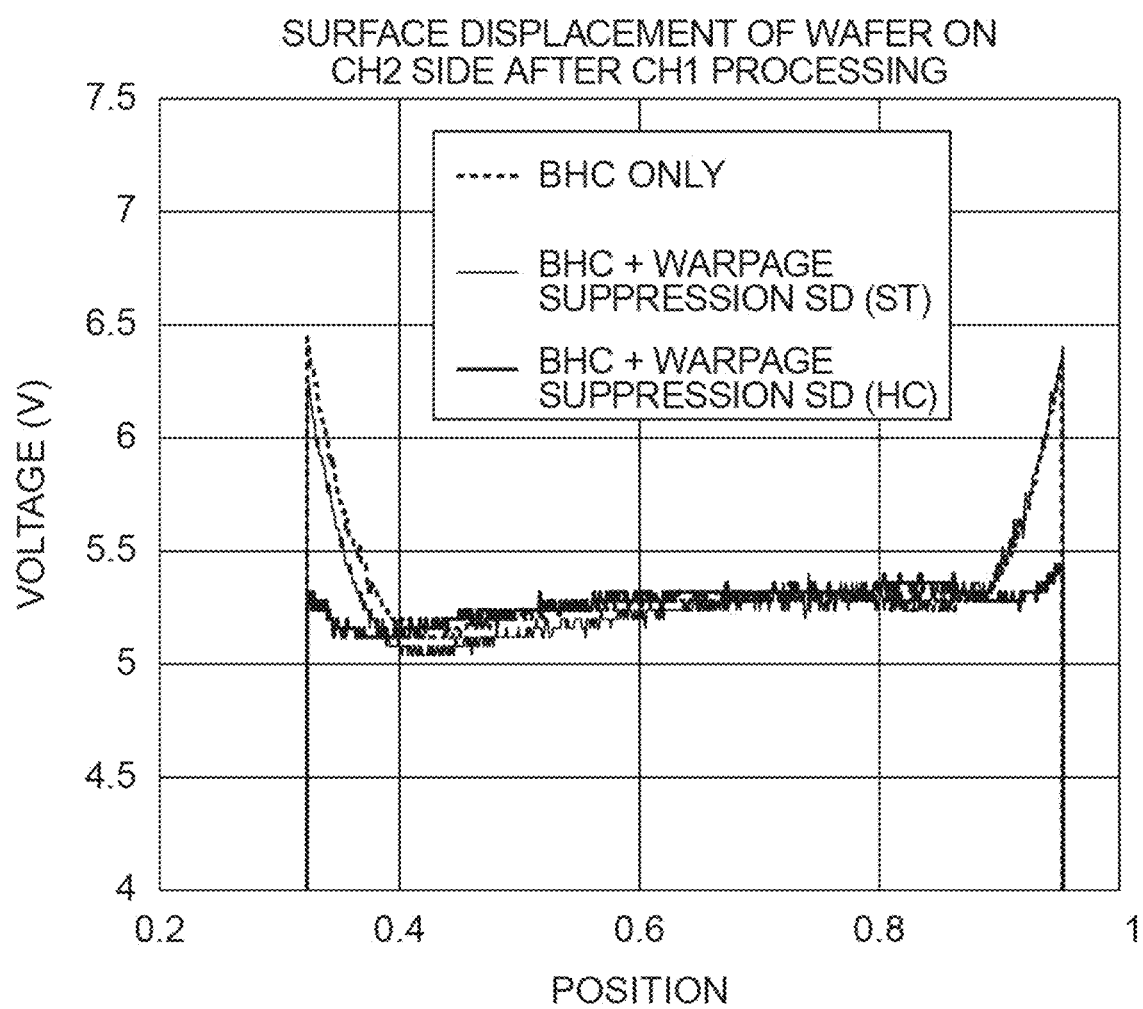
FIG. 21 is a view describing the actions and effects according to the present embodiment, and is a view showing warpage in the CH2 processing progress direction after the CH1 processing.

FIG. 21 is a view describing the actions and effects of the laser processing device 1 according to the present embodiment, and is a view showing warpage in the CH2 processing progress direction after the CH1 processing. In FIG. 21, the horizontal axis represents the CH2 processing progress direction (width direction of the wafer 20), and the vertical axis represents the displacement amount shown in voltage value. A voltage value of 1V on the vertical axis corresponds to, for example, a displacement amount of approximately 8 µm. FIG. 21 shows the amount of warpage after the CH1 processing and before the CH2 processing, and shows the results of the amount of warpage for each of the instances when the modified regions 12 for suppressing warpage are not formed (referred to as "BHC only" in FIG. 21), when the cracks 114 extending from the modified regions 12 for suppressing warpage are in the ST state (referred to as "BHC+ warpage suppression SD (ST)" in FIG. 21), and when the HC state where the cracks 114 extending from the modified regions 12 for suppressing warpage reach the back surface 21b is established (referred to as "BHC+ warpage suppression SD (HC)" in FIG. 21). FIG. 21 shows one example of the results when processing is performed under the conditions of workpiece size: 775 µm (65 mm×36 mm fragment), chip size: 1 mm, finish thickness after grinding: 80 µm, modified region for division: three passes (total crack: approximately 300 µm, BHC crack: approximately 80 µm), and modified region for suppressing warpage: one pass (total crack: approximately 60 µm). As is clear from FIG. 21, by forming the modified regions 12 for suppressing warpage, and by establishing the HC state where the cracks 114 extending from the modified regions 12 for suppressing warpage reach the back surface 21b, the warpage of the wafer 20 originating from BHC related to the formation of the modified regions 12 for division can be greatly reduced.

Figure 22:
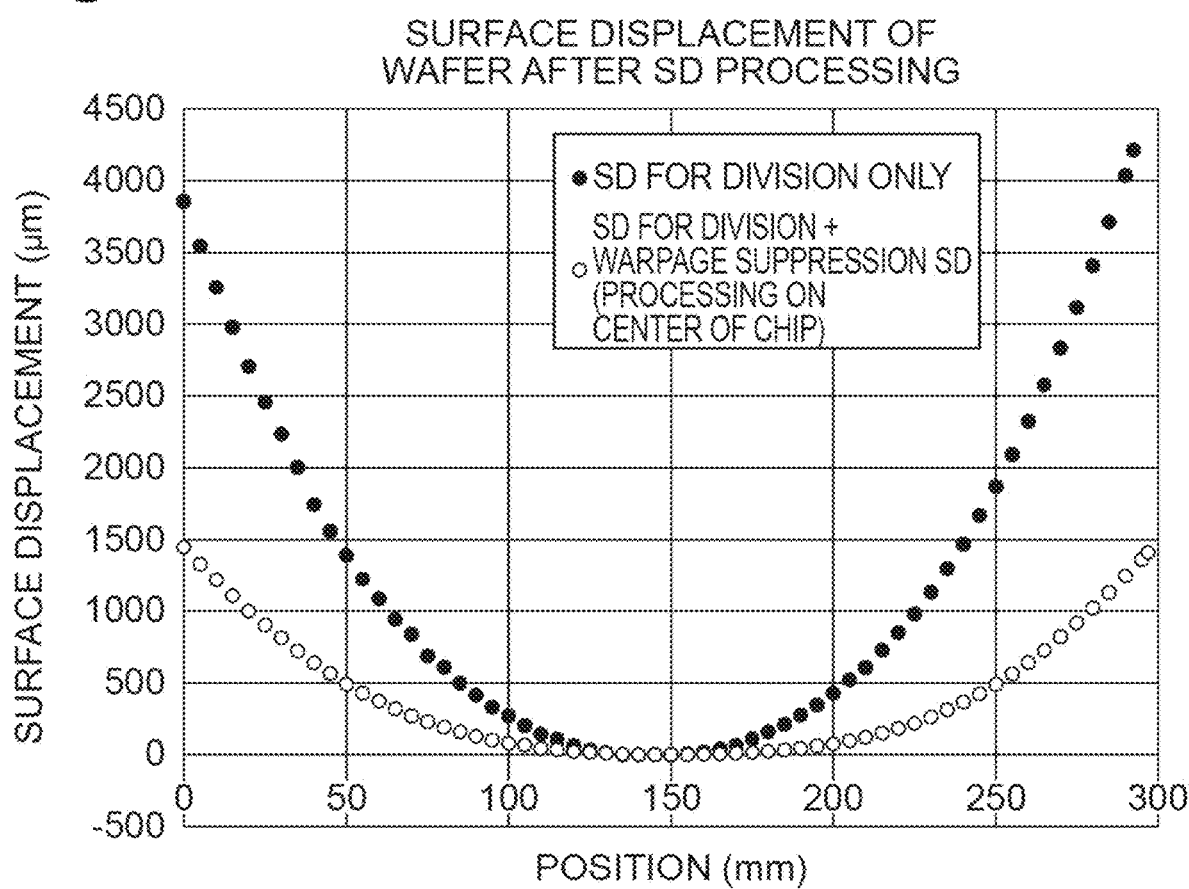
FIG. 22 is a view describing the actions and effects according to the present embodiment, and is a view showing the warpage of the wafer after the CH2 processing.

FIG. 22 is a view describing the actions and effects of the laser processing device 1 according to the present embodiment, and is a view showing warpage of the wafer 20 after the CH1 processing and the CH2 processing. In FIG. 22, the horizontal axis represents the position of the wafer 20 in the width direction, and the vertical axis represents the surface displacement. The surface displacement referred to here is measured by a microscope. FIG. 22 shows the surface displacement indicating the amount of warpage of the wafer 20 after the CH1 processing and the CH2 processing, and shows the surface displacement indicating the amount of warpage for each of the instances when the modified regions 12 for suppressing warpage are not formed (referred to as "SD for division only" in FIG. 22) and when the modified regions 12 for suppressing warpage are formed at the center of the chip (referred to as "SD for division+ warpage suppression SD (processing on the center of the chip)" in FIG. 22). FIG. 22 shows one example of the results when processing is performed under the conditions of workpiece size: 775 μm (12 inch), chip size: 1 mm, finish thickness after grinding: 80 μm, modified region for division: three passes (total crack: approximately 300 μm, BHC crack: approximately 80 μm), and modified region for suppressing warpage: three passes (total crack: approximately 150 μm). As shown in FIG. 22, when the modified regions 12 for suppressing warpage are formed at the center of the chip, the amount of warpage (displacement) at both end portions of the wafer 20 can be reduced to half or less compared to when the modified regions 12 for suppressing warpage are not formed. When the amount of warpage is large at both the end portions of the wafer 20, the wafer 20 cannot be appropriately suctioned to a conveying arm after processing, so that a conveyance failure such as dropping of the wafer 20 occurs, which is a risk. In this regard, regarding the wafer 20 in which the amount of warpage is reduced to half or less by the modified regions 12 for suppressing warpage as described above, the wafer 20 can be appropriately conveyed. In addition, no cracking occurs in the wafer 20 after conveyance.

In the third control, the control unit 8 may control the laser irradiation unit 3 to form the modified regions 12 for suppressing warpage at positions different from formation positions of the modified regions 12 for division in the Y direction. Accordingly, the continuity between the cracks 14 from the modified regions 12 for division and the cracks 114 from the modified regions 12 for suppressing warpage can be appropriately avoided, so that the occurrence of unintended cracking of the wafer 20 can be more suitably suppressed.

In the third control, the control unit 8 may control the laser irradiation unit 3 to form the modified regions 12 for suppressing warpage at intermediate positions in the Y direction between formation positions of two lines 15 adjacent to each other in the Y direction. By forming the modified regions 12 for suppressing warpage at exactly the middle positions interposed between the two lines 15, the separation distance between any of the modified regions 12 for division and the modified regions 12 for suppressing warpage can be increased, so that the continuity between the cracks 14 and the cracks 114 can be appropriately avoided. Accordingly, the occurrence of unintended cracking of the wafer 20 can be suitably suppressed.

In the third control, the control unit 8 may set a modulation pattern such that the modified regions 12 for suppressing warpage are formed at positions different from formation positions of the modified regions 12 for division in the Y direction. In such a manner, by adjusting the formation positions of the modified regions 12 for suppressing warpage through the setting of the modulation pattern of the spatial light modulator 7, the processing time can be shortened compared to when the formation positions of the modified regions 12 are changed by operating a stage 2.

In at least one of the first control and the third control, the control unit 8 may set the modulation pattern such that positions of end portions on a back surface 21b side of the cracks 14 are different from positions of end portions on a surface 21a side of the cracks 114. In such a manner, by adjusting the positions of the end portions of the cracks 14 and 114 extending from the modified regions 12 through the setting of the modulation pattern of the spatial light modulator 7, the positions of the end portions of the cracks 14 and 114 are appropriately adjusted, so that the occurrence of unintended cracking of the wafer 20 due to the continuity of the cracks 14 and 114 can be more suitably suppressed.

In the third control, the control unit 8 may control the laser irradiation unit 3 such that the cracks 114 extending from the modified regions 12 for suppressing warpage are shorter than the cracks 14 extending from the modified regions 12 for division. Unlike the cracks 14 extending from the modified regions 12 for division, since the cracks 114 extending from the modified regions 12 for suppressing warpage are not cracks that are desired to contribute to division, the occurrence of unintended cracking of the wafer 20 due to the continuity of the cracks 14 and 114 can be more suitably suppressed by shortening the cracks 114.

In the third control, the control unit 8 may control the laser irradiation unit 3 to form a larger number of the modified regions 12 for suppressing warpage than the number of the modified regions 12 for division in the Y direction. As described above, the cracks 114 extending from the modified regions 12 for suppressing warpage are desired to be shortened in terms of performing appropriate division. However, when the cracks 114 extending from the modified regions 12 for suppressing warpage are shortened, the warpage suppression effect is not sufficiently exhibited, which is a risk. In this regard, the number of the modified regions 12 for suppressing warpage is increased (larger than the number of the modified regions 12 for division), so that the cracks 114 extending from a large number of the modified regions 12 for suppressing warpage can suppress the occurrence of unintended cracking of the wafer 20 while sufficiently exhibiting the warpage suppression effect.

In the third control, the control unit 8 may control the laser irradiation unit 3 to form the modified regions 12 for suppressing warpage such that when the modified regions 12 for suppressing warpage at a central portion of the wafer 20 in the Y direction are compared to the modified regions 12 for suppressing warpage at both end portions, at least one of the number of the modified regions 12 for suppressing warpage in the Y direction being larger at both the end portions and a length of the cracks 114 extending from the modified regions 12 for suppressing warpage being larger at both the end portions is satisfied. The warpage of the wafer 20 caused by the formation of the modified regions 12 for division becomes noticeable toward both the end portions in the Y direction. In this regard, the number of the modified regions 12 for suppressing warpage is set to be larger at the central portion of the wafer 20 in the Y direction than at both the end portions, or the length of the cracks 114 extending from the modified regions 12 for suppressing warpage is increased, so that the warpage of the wafer 20 at both the end portions in the Y direction where the warpage is noticeable can be effectively suppressed.

The control unit 8 may control the laser irradiation unit 3 to alternately perform the formation of the modified regions 12 for division related to any of the lines 15 in the first control and the formation of the modified regions 12 for suppressing warpage. The warpage of the wafer 20 caused by the formation of the modified regions 12 for division gradually progresses as the formation of the modified regions 12 for division related to the plurality of lines 15 proceeds. For this reason, the processing on the lines 15 processed earlier affects the processing on the lines 15 processed later. Namely, in the processing on the lines 15 processed relatively later among the plurality of lines 15, since the modified regions 12 are formed in a state where the wafer 20 is warped, for example, the cracks 14 extend diagonally with respect to the surface 21*a* of the wafer 20, the processing position accuracy deteriorates, or poor suction occurs during processing, which is a risk. In this regard, the formation of the modified regions 12 for division and the formation of the modified regions 12 for suppressing warpage are alternately performed, so that the influence of the processing on the lines 15 processed earlier on the processing on the lines 15 processed later can be suppressed, and the modified regions 12 for division can be appropriately formed on the wafer 20.

Figure 23:
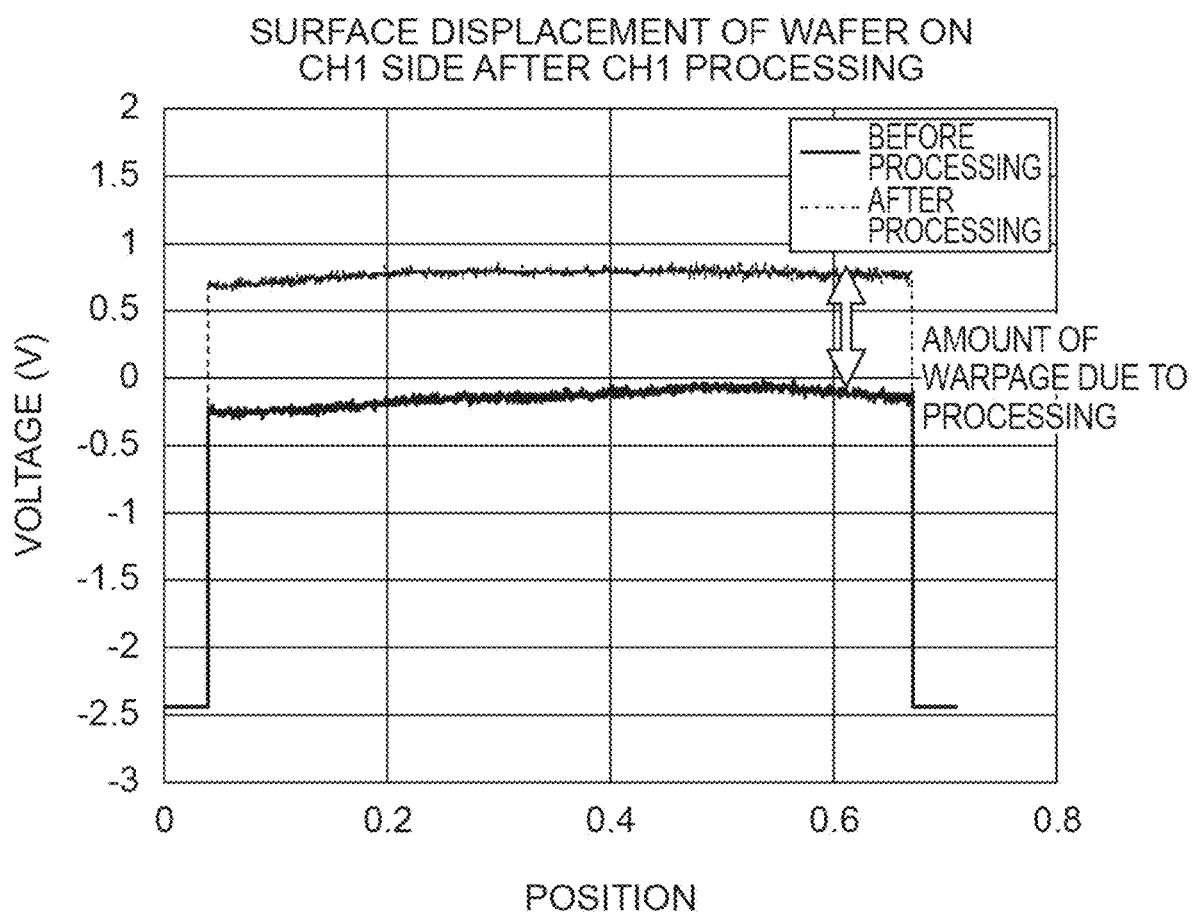
FIG. 23 is a view showing warpage in a CH1 processing progress direction after CH1 processing.

Incidentally, the formation of the modified regions 12 for suppressing warpage may not necessarily be performed in such CH1 processing (processing in which the formation of the modified regions 12 for division and the formation of the modified regions 12 for suppressing warpage are alternately performed), and for example, may be performed only when unevenness of the wafer 20 occurs in a CH1 processing direction after the CH1 processing. FIG. 23 is a view showing warpage in the CH1 processing progress direction after the CH1 processing. In FIG. 23, the horizontal axis represents the CH1 processing progress direction, and the vertical axis represents the displacement amount shown in voltage value. FIG. 23 shows one example of the results when the CH1 processing is performed under the conditions of workpiece size: 775 μm (65 mm×36 mm fragment), chip size: 1 mm, finish thickness after grinding: 80 μm, modified region for division: three passes (total crack: approximately 300 μm, BHC crack: approximately 80 μm), and measurement point: located at 1.5 mm from an end portion of the fragment. In the example shown in FIG. 23, the amount of warpage changes between before and after processing, but unevenness in the CH1 processing progress direction is not seen even after processing. In such a case, the formation of the modified regions 12 for suppressing warpage may not necessarily be formed in the CH1 processing, and the formation of the modified regions 12 for suppressing warpage may be formed before the CH2 processing.

The control unit 8 may be configured to further execute a fourth control to control the laser irradiation unit 3 to form a plurality of the modified regions 12 for suppressing warpage and the cracks 114 extending from the modified regions 12 inside the wafer 20 by performing irradiation with the laser beam L, the cracks 114 being formed to reach the back surface 21*b* and not to be continuous with the cracks extending from the modified regions 12 for division (second modified regions) in the CH2 processing, and may control the laser irradiation unit 3 to alternately perform the formation of the modified regions 12 related to any of the lines 15 in the second control and the formation of the modified regions 12 in the fourth control. In such a manner, by alternately performing the formation of the modified regions 12 in the CH2 processing and the formation of the modified regions 12 for suppressing warpage, even in the CH2 processing, the influence of the processing on the lines 15 processed earlier on the processing on the lines 15 processed later can be suppressed, and the modified regions 12 for division can be appropriately formed on the wafer 20.

REFERENCE SIGNS LIST

1: laser processing device, 3: laser irradiation unit, 7: spatial light modulator, 8: control unit, 12: modified region (first modified region, second modified region, third modified region), 14, 114: crack, 15: line (first line, second line), 20: wafer (object).

The invention claimed is:

1. A laser processing device comprising:
a laser irradiation unit that irradiates an object including a first surface and a second surface opposite to the first surface with a laser beam using the first surface of the object as an incident surface; and
a control unit, including at least one processor, that:
performs a first control to control the laser irradiation unit to form first modified regions for division and cracks extending from the first modified regions in a direction of the second surface inside the object by performing irradiation with the laser beam while moving a condensing spot of the laser beam relative to the object along each of a plurality of first lines extending in a first direction along the incident surface,
performs a second control to control the laser irradiation unit to form second modified regions for division and cracks extending from the second modified regions in the direction of the second surface inside the object by performing irradiation with the laser beam while moving the condensing spot of the laser beam relative to the object along each of a plurality of second lines intersecting the first direction and extending in a second direction along the incident surface, after the first control, and
performs a third control to control the laser irradiation unit to form a plurality of third modified regions for suppressing warpage and cracks extending from the third modified regions inside the object by performing irradiation with the laser beam before the second control, the cracks being formed to reach the first surface and not to be continuous with the cracks extending from the first modified regions.

2. The laser processing device according to claim 1, wherein in the third control, the control unit controls the laser irradiation unit to form the third modified regions at positions different from formation positions of the first modified regions in the second direction.

3. The laser processing device according to claim 2, wherein in the third control, the control unit controls the laser irradiation unit to form the third modified regions at intermediate positions in the second direction between formation positions of two first lines adjacent to each other in the second direction.

4. The laser processing device according to claim 2, wherein the laser irradiation unit includes a spatial light modulator that modulates the laser beam according to a set modulation pattern, and in the third control, the control unit sets the modulation pattern such that the third modified regions are formed at positions different from formation positions of the first modified regions in the second direction.

5. The laser processing device according to claim 1, wherein the laser irradiation unit includes a spatial light modulator that modulates the laser beam according to a set modulation pattern, and in at least one of the first control and the third control, the control unit sets the modulation pattern such that positions of end portions on a first surface side of the cracks extending from the first modified regions are different from positions of end portions on a second surface side of the cracks extending from the third modified regions.

6. The laser processing device according to claim 1, wherein in the third control, the control unit controls the laser irradiation unit such that the cracks extending from the third modified regions are shorter than the cracks extending from the first modified regions.

7. The laser processing device according to claim 6, wherein in the third control, the control unit controls the laser irradiation unit to form a larger number of the third modified regions than the number of the first modified regions in the second direction.

8. The laser processing device according to claim 1, wherein in the third control, the control unit controls the laser irradiation unit to form the third modified regions such that when the third modified regions at a central portion of the object in the second direction are compared to the third modified regions at both end portions, at least one of the number of the third modified regions in the second direction being larger at both the end portions and a length of the cracks extending from the third modified regions being larger at both the end portions is satisfied.

9. The laser processing device according to claim 1, wherein the control unit controls the laser irradiation unit to alternately perform the formation of the first modified regions related to any of the first lines in the first control and the formation of the third modified regions in the third control.

10. The laser processing device according to claim 9, wherein the control unit further:
performs a fourth control to control the laser irradiation unit to form a plurality of fourth modified regions for suppressing warpage and cracks extending from the fourth modified regions inside the object by performing irradiation with the laser beam, the cracks being formed to reach the first surface and not to be continuous with the cracks extending from the second modified regions, and controls the laser irradiation unit to alternately perform the formation of the second modified regions related to any of the second lines in the second control and the formation of the fourth modified regions in the fourth control.

11. A laser processing method for performing laser processing on an object including a first surface and a second surface opposite to the first surface by irradiating the object with a laser beam using the first surface of the object as an incident surface, the method comprising:
a first step of forming first modified regions for division and cracks extending from the first modified regions in a direction of the second surface inside the object by performing irradiation with the laser beam while moving a condensing spot of the laser beam relative to the object along each of a plurality of first lines extending in a first direction along the incident surface;

a second step of forming second modified regions for division and cracks extending from the second modified regions in the direction of the second surface inside the object by performing irradiation with the laser beam while moving the condensing spot of the laser beam relative to the object along each of a plurality of second lines intersecting the first direction and extending in a second direction along the incident surface, after the first step; and a third step of forming a plurality of third modified regions for suppressing warpage and cracks inside the object by performing irradiation with the laser beam before the second step, the cracks being formed to reach the first surface from the third modified regions and not to be continuous with the cracks extending from the first modified regions.

12. The laser processing method according to claim 11, wherein in the third step, the third modified regions are formed at positions different from formation positions of the first modified regions in the second direction.

13. The laser processing method according to claim 12, wherein in the third step, the third modified regions are formed at intermediate positions in the second direction between formation positions of two first lines adjacent to each other in the second direction.

14. The laser processing method according to claim 12, wherein in the third step, the third modified regions are formed at the positions different from the formation positions of the first modified regions in the second direction, by setting a modulation pattern of a spatial light modulator that modulates the laser beam.

15. The laser processing method according to claim 11, wherein in at least one of the first step and the third step, positions of end portions on a first surface side of the cracks extending from the first modified regions are set to differ from positions of end portions on a second surface side of the cracks extending from the third modified regions, by setting a modulation pattern of a spatial light modulator that modulates the laser beam.

16. The laser processing method according to claim 11, wherein in the third step, the third modified regions are formed such that the cracks extending from the third modified regions are shorter than the cracks extending from the first modified regions.

17. The laser processing method according to claim 16, wherein in the third step, a larger number of the third modified regions than the number of the first modified regions are formed in the second direction.

18. The laser processing method according to claim 11, wherein in the third step, the third modified regions are formed such that when the third modified regions at a central portion of the object in the second direction are compared to the third modified regions at both end portions, at least one of the number of the third modified regions in the second direction being larger at both the end portions and a length of the cracks extending from the third modified regions being larger at both the end portions is satisfied.

19. The laser processing method according to claim 11, wherein the formation of the first modified regions related to any of the first lines in the first step and the formation of the third modified regions in the third step are alternately performed.

20. The laser processing method according to claim 19, further comprising:
a fourth step of forming a plurality of fourth modified regions for suppressing warpage and cracks inside the object by performing irradiation with the laser beam, the cracks being formed to reach the first surface from the fourth modified regions and not to be continuous with the cracks extending from the second modified regions, wherein the formation of the second modified regions related to any of the second lines in the second step and the formation of the fourth modified regions in the fourth step are alternately performed.

* * * * *